US00RE49596E

(19) United States
(12) Reissued Patent
Youn et al.

(10) Patent Number: US RE49,596 E
(45) Date of Reissued Patent: Aug. 1, 2023

(54) FLEXIBLE DISPLAY DEVICE AND METHOD FOR MANUFACTURING THE SAME

(71) Applicant: LG Display Co., Ltd., Seoul (KR)

(72) Inventors: Sang-Cheon Youn, Seoul (KR); Hyoung-Suk Jin, Paju-si (KR); Chang-Heon Kang, Paju-si (KR); Se-Yeoul Kwon, Goyang-si (KR)

(73) Assignee: LG DISPLAY CO., LTD., Seoul (KR)

(21) Appl. No.: 16/999,784

(22) Filed: Aug. 21, 2020

Related U.S. Patent Documents

Reissue of:
(64) Patent No.: 9,293,485
Issued: Mar. 22, 2016
Appl. No.: 14/744,586
Filed: Jun. 19, 2015

U.S. Applications:
(62) Division of application No. 15/825,950, filed on Nov. 29, 2017, now Pat. No. Re. 49,052, which is an (Continued)

(30) Foreign Application Priority Data

May 28, 2013 (KR) ..... 10-2013-0060169

(51) Int. Cl.
*H10K 77/10* (2023.01)
*H01L 27/12* (2006.01)
(Continued)

(52) U.S. Cl.
CPC ..... *H10K 77/111* (2023.02); *H01L 24/06* (2013.01); *H01L 27/124* (2013.01);
(Continued)

(58) Field of Classification Search
CPC ..... H01L 27/3288; H01L 51/0097; H01L 27/124; H01L 24/06; H01L 27/1259;
(Continued)

(56) References Cited

U.S. PATENT DOCUMENTS 6,486,544 B1 * 11/2002 Hashimoto ..... H01L 25/0657 257/E21.503
2002/0067456 A1 6/2002 Tatsumi
(Continued)

FOREIGN PATENT DOCUMENTS

CN 1507009 A 6/2004
CN 1607895 A 4/2005
(Continued)

OTHER PUBLICATIONS

U.S. Appl. No. 15/825,950, filed Nov. 29, 2017.
U.S. Appl. No. 14/744,586, filed Jun. 19, 2015.
U.S. Appl. No. 14/134,925, filed Dec. 19, 2013.

*Primary Examiner* — Minh Nguyen
(74) *Attorney, Agent, or Firm* — Birch, Stewart, Kolasch & Birch, LLP

(57) ABSTRACT

Discussed is a flexible display device to reduce a width of a bezel. The flexible display device includes a substrate being formed of a flexible material, a plurality of gate lines and a plurality of data lines crossing each other, a plurality of pads formed in a pad area of a non-display area, a plurality of links formed in a link area of the non-display area a plurality of insulation films formed over the entire surface of the substrate, and a first bending hole formed in a bending area of the non-display area, the first bending hole passing through at least one of the insulation films disposed under the link, wherein the bending area is bent such that the pads are disposed on the lower surface of the substrate.

20 Claims, 24 Drawing Sheets

Related U.S. Application Data application for the reissue of Pat. No. 9,293,485, which is a division of application No. 14/134,925, filed on Dec. 19, 2013, now Pat. No. 9,082,667.

(51) Int. Cl.
*H01L 23/00* (2006.01)
*H10K 59/179* (2023.01)
*H10K 59/131* (2023.01)

(52) U.S. Cl.
CPC ..... *H01L 27/1259* (2013.01); *H10K 59/179* (2023.02); *H01L 2924/00* (2013.01); *H01L 2924/12041* (2013.01); *H01L 2924/12044* (2013.01); *H10K 59/131* (2023.02); *Y02E 10/549* (2013.01); *Y02P 70/50* (2015.11)

(58) Field of Classification Search
CPC ..... H01L 2924/12044; H01L 27/3276; H01L 2924/12041; H01L 2924/00; Y02P 70/50; Y02E 10/549
See application file for complete search history.

(56) References Cited

U.S. PATENT DOCUMENTS

| | | | |
|---|---|---|---|
| 2004/0207569 | A1 | 10/2004 | Ho et al. |
| 2005/0078446 | A1 | 4/2005 | Bae |
| 2005/0078459 | A1 | 4/2005 | Yeon |
| 2005/0253773 | A1 | 11/2005 | Sekiguchi |
| 2007/0035473 | A1 | 2/2007 | Yamazaki et al. |
| 2007/0229751 | A1 | 10/2007 | Ko et al. |
| 2008/0062373 | A1 | 3/2008 | Kim et al. |
| 2011/0007042 | A1 | 1/2011 | Miyaguchi |
| 2012/0146886 | A1 | 6/2012 | Minami et al. ..... G09G 3/3266 345/80 |
| 2013/0002583 | A1 | 1/2013 | Jin et al. |
| 2013/0119368 | A1 | 5/2013 | Nakamura et al. |
| 2014/0042406 | A1 | 2/2014 | Degner et al. |
| 2014/0097408 | A1 | 4/2014 | Kim et al. |
| 2014/0240985 | A1 | 8/2014 | Kim et al. |

FOREIGN PATENT DOCUMENTS

| | | | |
|---|---|---|---|
| EP | 2 073 054 | A2 | 6/2009 |
| GB | 2 396 244 | A | 6/2004 |
| JP | 6-194680 | A | 7/1994 |
| JP | 2002-131773 | A | 5/2002 |
| JP | 2005-123622 | A | 5/2005 |
| JP | 2011-34066 | A | 2/2011 |
| JP | 2012-128006 | A | 7/2012 |
| JP | 2012-174473 | A | 9/2012 |
| JP | 2013-15836 | A | 1/2013 |
| KR | 10-2001-0031776 | A | 4/2001 |
| WO | WO 2006/129223 | A1 | 12/2006 |

* cited by examiner

FLEXIBLE DISPLAY DEVICE AND METHOD FOR MANUFACTURING THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application is a *broadening Divisional Reissue application of U.S. patent application Ser. No. 15/825,950, filed on Nov. 29, 2017, which is a broadening Reissue application of U.S. Pat. No. 9,293,485 issued on Mar. 22, 2016* (*U.S. application Ser. No. 14/744,586 filed Jun. 19, 2015*), *which is a* Divisional of [co-pending] U.S. application Ser. No. 14/134,925 filed on Dec. 19, 2013 (*now U.S. Pat. No. 9,082,667 issued Jul. 14, 2015*), which claims the benefit of Korean Patent Application No. 10-2013-0060169, filed on May 28, 2013 *in the Republic of Korea*, [which] *all of these applications* are all hereby incorporated by reference as if fully set forth herein. *Notice: More than one reissue application has been filed for the reissue of U.S. Pat. No. 9,293,485. The reissue applications are application Ser. Nos. 15/825,950* (*parent application*) *and the present application.*

BACKGROUND OF THE INVENTION

1. Field of the Invention

The present invention relates to a flexible display device and a method for manufacturing the same to reduce a width of a peripheral edge area (i.e.., bezel) of a display area.

2. Discussion of the Related Art

As part of the evolution of the information age, the field of displays to visually display electric information signals is rapidly growing. In response to this trend, a great deal of research to increase performance such as slimness, weight reduction and low power consumption of various flat display devices continues.

Representative examples of flat display devices include liquid crystal displays (LCDs), plasma display panels (PDPs), field emission displays (FEDs), electro-luminescent displays (ELDs), electrowetting displays (EWDs), organic light emitting diode (OLEDs) displays and the like. These flat display devices, in common, necessarily include a flat display panel. The flat display panel has a structure in which a pair of substrates is joined via an inherent luminous or polarizing substance while facing each other.

Recently, flat display devices may be implemented into flexible display devices using flexible substrates made of flexible materials such as plastics to maintain display performance while being bendable like paper.

Such a flexible display device may be more widely applied than conventional display devices lacking flexibility, and research and development into practical applications of flexible display devices continues.

Meanwhile, in general, flat display devices including flexible display devices include a display area to actually display an image and a non-display area to enable connection to various driving circuits or exterior circuits as a region other than the display area.

In this regard, as a width of a peripheral edge region, that is, a bezel, of the display area, increases, the display area appears to the observer to be smaller, and product values of display devices, associated with aesthetics and usability are lowered.

Therefore, research and development associated with reduction of width of the non-display area in order to reduce bezel width are made. However, disadvantageously, there is a limitation to reduction of width in the non-display area due to areas corresponding to pads for connection to driving circuits or exterior circuits disposed in the non-display area.

SUMMARY OF THE INVENTION

Accordingly, the present invention is directed to a flexible display device and a method for manufacturing the same that substantially obviate one or more problems due to limitations and disadvantages of the related art.

An object of the present invention is to provide a flexible display device including a bezel having a width narrower than a non-display area using flexibility of flexible substrates and a method for manufacturing the same.

To achieve these objects and other advantages and in accordance with the purpose of the invention, as embodied and broadly described herein, provided is a flexible display device including a substrate defined by a display area and a non-display area being an outer region of the display area and including a link area and a pad area, the substrate being formed of a flexible material, a plurality of gate lines and a plurality of data lines formed in the display area on the substrate, such that the gate lines and the data lines cross each other to define a plurality of pixel areas in the display area, a plurality of pads formed in the pad area, each pad being connected to an exterior circuit to supply a driving signal to a signal line selected from the gate line and the data line, a plurality of links formed in the link area, the links connecting the respective pads and the signal lines, a plurality of insulation films formed over the entire surface of the substrate, the insulation films insulating conductive layers from one another, and a first bending hole formed in a bending area of the non-display area, the first bending hole passing through at least one of the insulation films disposed under the link, wherein the bending area is bent such that the pads are disposed on the lower surface of the substrate.

In accordance with another aspect of the present invention, provided is a method for manufacturing a flexible display device including forming a substrate defined by a display area and a non-display area being an outer region of the display area and including a link area and a pad area, using a flexible material, forming a buffer film over the entire surface of the substrate, forming a gate insulation film over the entire surface of the buffer film, forming gate lines in the display area on the gate insulation film, forming an interlayer insulation film over the entire surface of the gate insulation film such that the interlayer insulation film covers the gate lines, forming a first bending hole passing through at least the gate insulation film, and the interlayer insulation film in a bending area, wherein the bending area bends such that the pad area of the non-display area is disposed on the lower surface of the substrate, forming data lines and a plurality of links, wherein the data lines formed in the display area on the interlayer insulation film such that the data lines cross the gate lines, and wherein the plurality of links are connected to signal lines selected from the gate lines and the data lines in the linking area on the interlayer insulation film, forming a protective film over the entire surface of the interlayer insulation film such that the protective film covers the data lines and the links, forming a plurality of pads connected to the links and connected to an exterior circuit to supply a driving signal to the signal line on the protective film, and bending the bending area such that the pads are disposed on the lower surface of the substrate.

The flexible display device according to the embodiments of the present invention can reduce a width of a bezel without reducing a width of the non-display area, since the plurality of pads are disposed on the lower surface of the substrate by bending the bending area. Accordingly, the display devices have improved product values associated with aesthetics and usability.

The flexible display device includes the first bending hole, thus enabling removal of parts of each the buffer film, the gate insulation film and the interlayer insulation film which correspond to the bending area. As a result, it is possible to prevent problems such as application of relatively greater bending stress to the buffer film, the gate insulation film and the interlayer insulation film than bending stress to the substrate, when the bending area is bent, generation of cracks and thus breakage (disconnection) of links (wiring). As a result, it is possible to improve reliability and yield of the display device.

In addition, the flexible display device further includes an anti-etching layer between the substrate and the buffer film in a part of the non-display area, that is, in a region including the first bending hole, thus preventing the substrate from being etched by an etching process to form the first bending hole. As a result, it is possible to prevent permeation of foreign matter causing defects and thereby improve reliability and yield of the display device.

BRIEF DESCRIPTION OF THE DRAWINGS

FIGS. 14a to 14e, 15a to 15g, and 16a and 16b are views illustrating a method for manufacturing the flexible display device described in FIGS. 12 and 13;

DETAILED DESCRIPTION OF THE INVENTION

Hereinafter, a flexible display device and a method for manufacturing the same according to the present invention will be described in detail with reference to the annexed drawings.

First, a flexible display device according to a first embodiment of the present invention will be described with reference to FIGS. 1 to 6.

Figure 1:
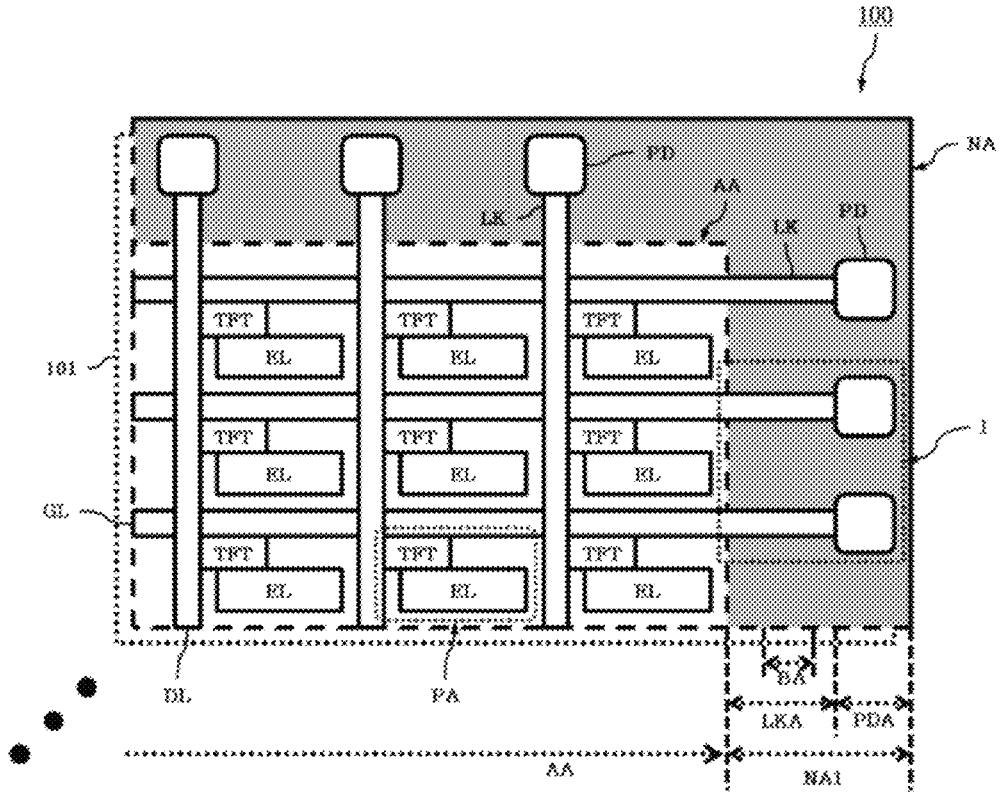
FIG. 1 is a plan view illustrating a flexible display device according to the first embodiment of the present invention.
Figure 2:
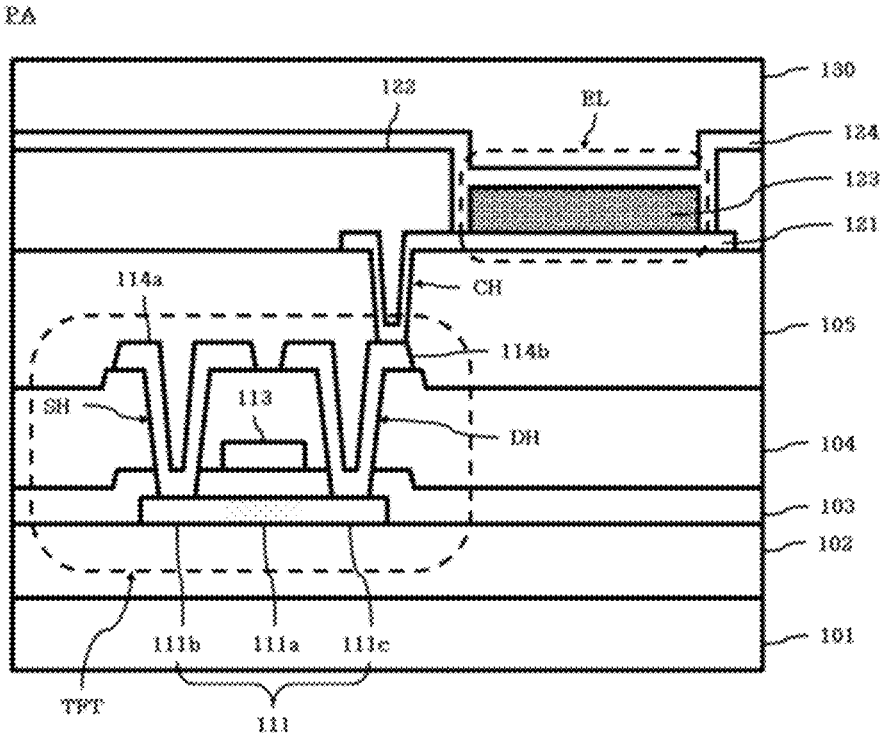
FIG. 2 is a sectional view illustrating a pixel area according to the first embodiment of the present invention.
Figure 3:
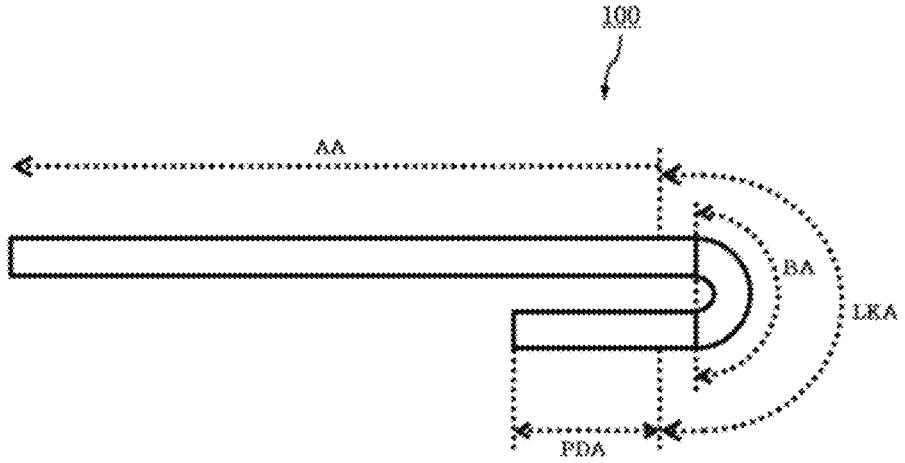
FIG. 3 is a sectional view illustrating a state in which a bending area of a substrate is bent in the flexible display device of FIG. 1.
Figure 4:
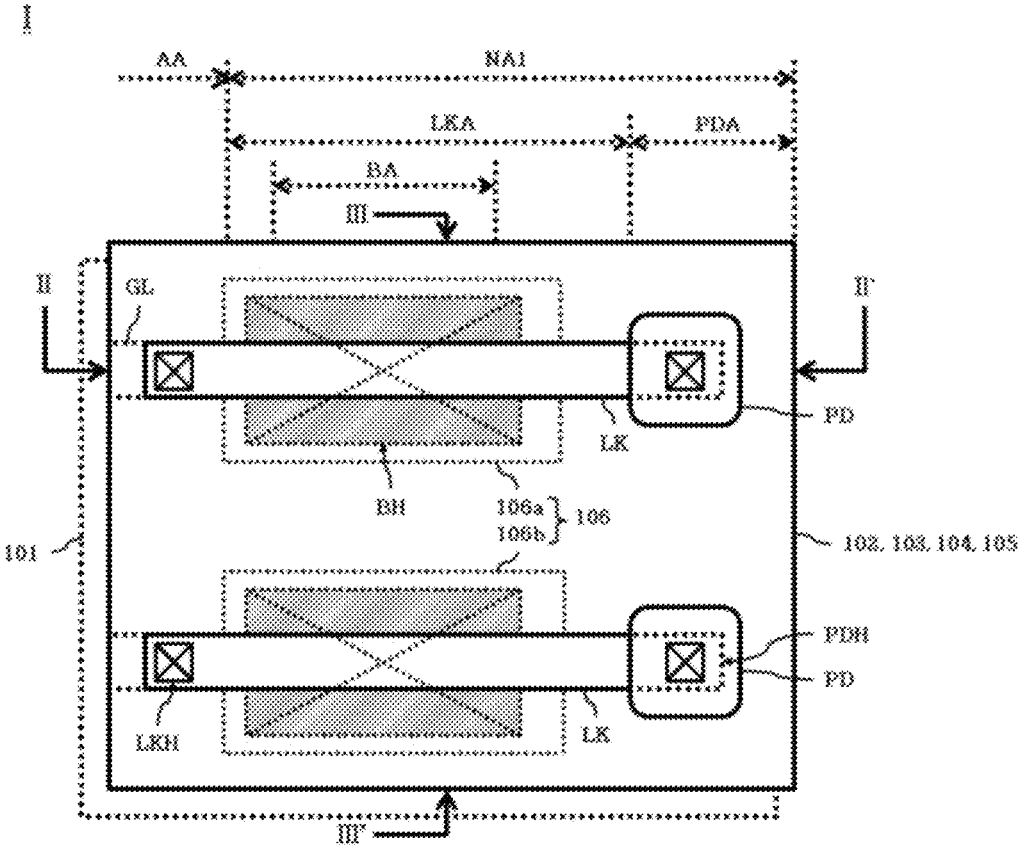
FIG. 4 is a plan view illustrating a part I of FIG. 1.
Figure 5:
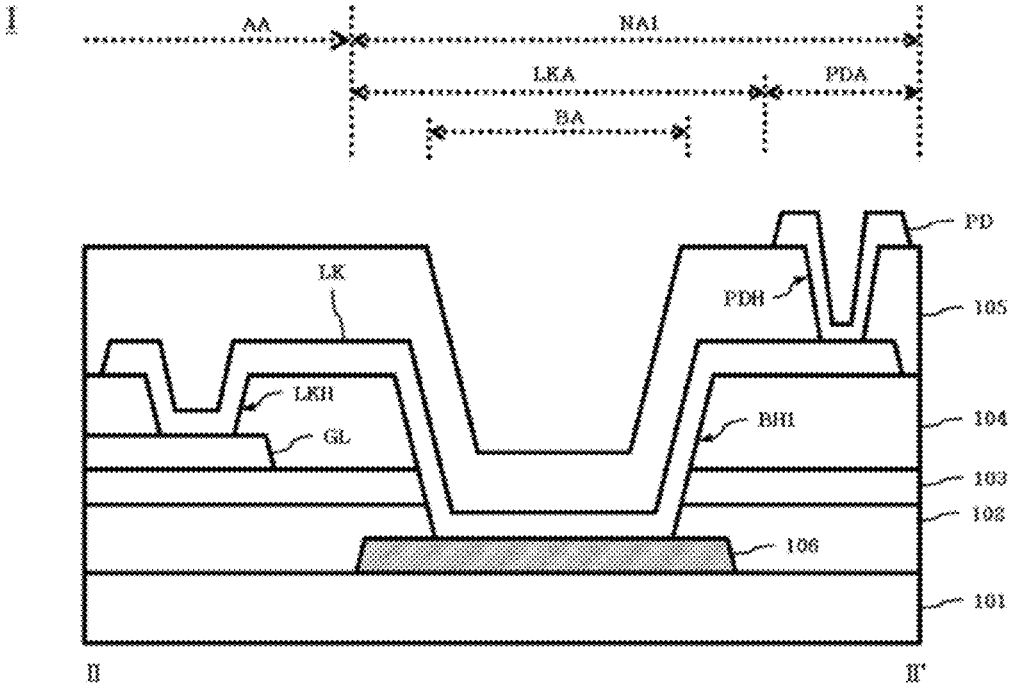
FIG. 5 is a sectional view illustrating a part II-II of FIG. 4.
Figure 6:
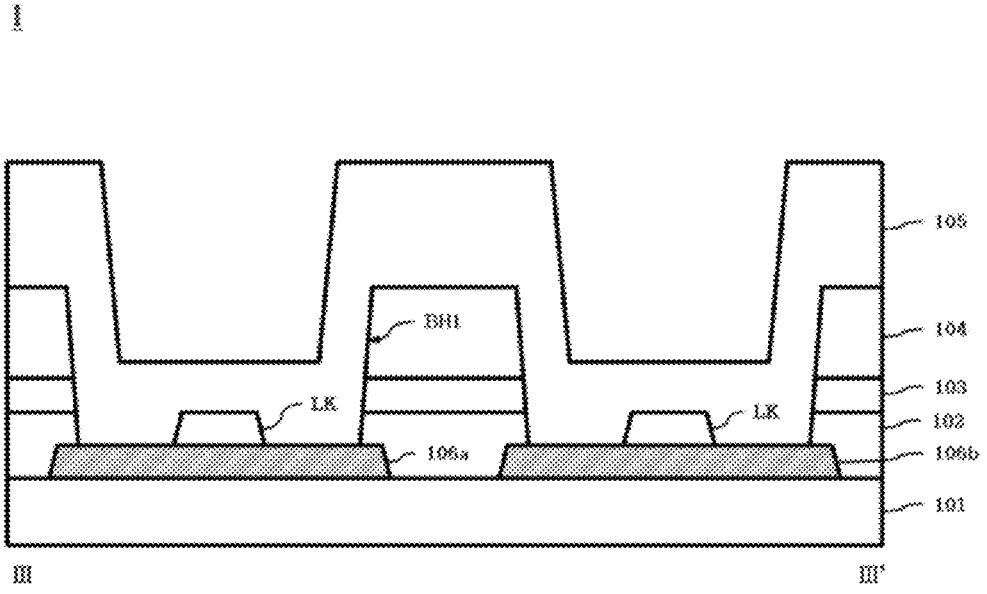
FIG. 6 is a sectional view illustrating a part III-III' of FIG. 4.

FIG. 1 is a plan view illustrating a flexible display device according to the first embodiment of the present invention. FIG. 2 is a sectional view illustrating a pixel area according to the first embodiment of the present invention. FIG. 3 is a sectional view illustrating a state in which a bending area of a substrate is bent in the flexible display device of FIG. 1. FIG. 4 is a plan view illustrating a part 1 of FIG. 1. FIG. 5 is a sectional view illustrating a part II-II' of FIG. 4. FIG. 6 is a sectional view illustrating a part of FIG. 4.

As shown in FIG. 1, the flexible display device 100 according to the first embodiment of the present invention includes: a substrate 101; a plurality of gate lines GLs and a plurality of data lines DLs; a plurality of pads PD; a plurality of links LK; and insulation films 102, 103, 104 and 105 (not shown in FIG. 1, but shown in below-described FIG. 2).

The substrate 101 is formed of a flexible material. The substrate 101 is defined by a display area AA and a non-display area NA which is an outer region of the display area AA. The non-display area NA includes a link area LKA and a pad area PDA. The plurality of gate lines GLs and the plurality of data lines DLs are formed in the display area AA on the substrate 101, such that the gate lines GLs and the data lines DLs independently cross each other to define a plurality of pixel areas PA in the display area AA. The plurality of pads PD is formed in the pad area PDA. The plurality of pads PD is connected to exterior circuits to supply a driving signal to a signal line selected from the gate line GL and the data line DL. The plurality of links LK is formed in the link area LKA. The plurality of links LK connects the pads PD and the signal lines selected from GLs and DLs. The insulation films 102, 103, 104 and 105 are formed over the entire surface of the substrate. The insulation films 102, 103, 104 and 105 insulate conductive layers from one another.

The display device 100 further includes a plurality of thin film transistors TFTs; and a light emitting array. The plurality of thin film transistors TFTs are formed at the intersections between the gate lines GLs and the data lines DLs corresponding to the respective pixel areas PA. The light emitting array includes a plurality of light emitting elements EL formed in the respective pixel areas PA.

For example, as shown in FIG. 2, the flexible display device 100 includes the substrate 101 formed of a flexible material, a buffer film 102 formed over the entire surface of the substrate 101, and a plurality of TFTs and a plurality of light emitting elements ELs formed in the display area on the buffer film 102.

The substrate 101 is formed of a plastic or a metal as a flexible material. In case that the substrate 101 is formed of a plastic, a plastic having high heat resistance is selected while taking into consideration the fact that the substrate 101 is exposed to a high temperature atmosphere during deposition and etching processes of various films.

For example, the substrate 101 may be formed of a polymer plastic material such as polyimide (PI), polyethersulforte (PES), polyacrylate (PAR), polyetherimide (PEI), polyethylene naphthalate (PET), and polyethylene terephthalate (PET). Alternatively, the substrate 101 may be formed of a metal such as aluminum o copper.

The buffer film 102 prevents deterioration factors such as moisture or oxygen from permeating into the light emitting element EL through the substrate 101. The buffer film 102 has a laminate structure of two or more insulation films wherein the insulation films are different in terms of at least one of thickness, component and compositional ratio. For example, the buffer film 102 may be formed of SiNx or SiOy.

Each thin film transistor TFT includes: an active layer 111; a gate insulation film 103; a gate electrode 113; an interlayer insulation film 104; a source (or drain) electrode 114a; a drain (or source) electrode 114b; and a protective film 105.

The active layer 111 is formed in a part of each pixel area PA on the buffer film 102. The active layer 111 forms a channel based on a gate voltage of the gate electrode. The active layer 111 includes a channel area 111a, a source region 111b, and drain region 111c. The channel area 111a overlaps at least a part of the gate electrode 113 on the gate insulation film 103 to form a channel according to a voltage level of the gate electrode 113. The source region 111b and the drain region 111c are disposed at both sides of the channel area 111a.

The gate insulation film 103 is formed over the entire surface of the buffer film 102 such that the gate insulation film 103 covers the active layer 111. The gate electrode 113 is formed on the gate insulation film 103 such that at least a part of the gate electrode 113 overlaps the channel area 111a of the active layer 111. The gate electrode 113 is connected with the data line DL. The interlayer insulation film 104 is formed on the gate insulation film 103 such that the interlayer insulation film 104 covers the gate electrode 113.

The source electrode 114a is formed on the interlayer insulation film 104 such that the source electrode 114a overlaps the source region 111b. The source electrode 114a is connected to the data line DL. In addition, the source electrode 114a is also connected to a source region 111b through a source hole SH which passes through the gate insulation film 103 and the interlayer insulation film 104 to expose at least a part of the source region 111b.

Similarly, the drain electrode 114b is formed on the interlayer insulation film 104 such that the drain electrode 114b overlaps the drain region 111c. The drain electrode 114b is connected to the light emitting element EL in each pixel area PA. In addition, the drain electrode 114b is also connected to a drain region 111c through a drain hole DH which passes through the gate insulation film 103 and the interlayer insulation film 104 to expose at least a part of the drain region 111c.

The protective film 105 is formed on the interlayer insulation film 104 such that the protective film 105 covers the source electrode 114a and the drain electrode 114b. Furthermore, although not illustrated in FIG. 2, the gate line (GL of FIG. 1) is formed together with the gate electrode 113 on the gate insulation film 103.

In addition, the data line (DL of FIG. 1, not shown in FIG. 2) is formed on the interlayer insulation film 104 together with the source electrode 114a and the drain electrode 114b.

Each light emitting element (EL) includes: a first electrode 121; a bank 122; a light emitting layer 123; and a second electrode 124. The first electrode 121 is formed in each pixel area PA on the protective film 105. The bank 122 is formed on a periphery of each pixel area PA on the protective film 105 to overlap at least a part of the edge of the first electrode 121. The light emitting layer 123 is formed on the first electrode 121. The second electrode 124 is formed on the entire surfaces of the light emitting layer 123 and the bank 122 such that the second electrode 124 faces the first electrode 121 via the light emitting layer 123.

The first electrode 121 is connected to the drain electrode 114b through a contact hole CH that passes through the protective film 105 to expose at least a part of the drain electrode 114b.

The light emitting layer 123 between the first electrode 121 and the second electrode 124 emits light based on current applied from the thin film transistor TFT.

The flexible display device 100 further includes a sealing layer 130. The sealing layer 130 faces the substrate 101 via the light emitting array including the light emitting elements ELs in the display area AA. The sealing layer 130 seals the light emitting array. The sealing layer 130 prevents permeation of deterioration factors such as oxygen or moisture into the light emitting elements EL.

Description will be given with reference to FIG. 1 again.

Although not described in detail in FIG. 1, in general, an upper surface of the substrate 101 has a rectangular shape having four sides. When the display area AA is disposed in the center of the upper surface of the substrate 101, the non-display area NA includes four side areas parallel to one another at different sides of the substrate 101. However, this disposition is provided only as an example, and it is clear that the non-display area NA may include one or more side areas according to the shape of the substrate 101, shape of the display area AA and position of the display area AA in the substrate 101.

As shown in FIG. 1, a side area (NA1, corresponding to a right side of the outer region of the display area AA in FIG. 1) of the non-display area NA includes a pad area PDA provided with pads PD, and a link area LKA which is interposed between the pad area PDA and the display area AA and is provided with a plurality of links LK. In addition, a portion of the side area NA1 parallel to one side of the substrate 101 corresponds to a bending area which is bent such that the pad PD is disposed on the lower surface of the substrate 101.

in FIG. 1, among the non-display area NA, only the right side area NA1, where the pad PD corresponding to the gate line CT is disposed, includes the bending area BA. However, this disposition is provided as an example and each side area of the non-display area NA includes a bending area BA. That is, among the non-display area NA, a side area (corresponding to the non-display area NA disposed in an upper side of display area AA in FIG. 1), where the pad PD corresponding to the data line DL is disposed, also includes a bending area BA such that the pad PD connected to the data line DL is disposed on the lower surface of the substrate 101.

Here, at least a part of the link area LKA becomes the bending area BA, therefore a part of each link LK is disposed on the bending area BA. In FIG. 1, a part of the link area LKA is the bending area BA. This configuration is provided only as an example and the bending area BA may be wider than the link area LKA.

Specifically, as shown in FIG. 3, the bending area BA of the substrate 101 is bent to enable the pad of the pad area PDA (PD of FIG. 1) to be disposed on the lower surface of the substrate 101.

An insulating material, in particular, an inorganic insulating material may be used to form at least one of the buffer film 102, the gate insulation film 103 and the interlayer insulation film 104. They are in general harder than the flexible material which is used to form the substrate 101. Therefore, when the substrate 101 bends in the bending area BA on condition that the insulating material is disposed in the bending area BA, bending stress is applied to the insulating material. For this reason, cracks may develop in the insulating material. The cracks of the insulating material also have an effect on the link LK, thus disadvantageously causing defects such as breakage (disconnection) of the link LK.

In order to prevent breakage (disconnection) defects caused by bending stress, the amount of the insulating material disposed in the bending area BA should be minimized.

Thus, the flexible display device according to the first embodiment of the present invention further includes a first bending hole disposed in the bending area BA.

As shown in FIGS. 4 and 5, the flexible display device 100 further includes: an anti-etching layer 106; and a first bending hole BH1. The anti-etching layer 106 forms in at least one side area NM of the non-display area NA on the substrate 101. The first bending hole BH1 is formed in the bending area BA, wherein the first bending hole BH1 passes through at least one insulation film disposed under the link LK among a plurality of insulation films including a buffer film 102, a gate insulation film 103, an interlayer insulation film 104 and a protective film 105.

The first bending hole BH1 is formed to expose at least a part of the anti-etching layer 106. Each link LK disposed on the interlayer insulation film 104 directly contacts at least a part of the anti-etching layer 106 exposed through the first bending hole BH1.

The anti-etching layer 106 functions to prevent exposure of the substrate 101 during etching of the buffer film 102, the gate insulation film 103 and the interlayer insulation film 104 to form the first bending hole BH1.

That is, when the buffer film 102, the gate insulation film 103 and the interlayer insulation film 104 are inorganic insulating materials, dry etching is generally used to form the first bending hole BH1 passing through the buffer film 102, the gate insulation film 103 and the interlayer insulation film 104. In this case, when the substrate 101 is a plastic material, the first bending hole BH1 is formed under over-etching conditions and is then exposed to dry etching. For this reason, the substrate 101 is also etched, thus causing generation of foreign matter. This foreign matter causes defects, such as breakage (disconnection) or short circuit, and damage to the light emitting layer (123 of FIG. 2), thus deteriorating reliability and yield of the flexible display device 100.

Thus, according to the first embodiment of the present invention, the flexible display device 100 includes the anti-etching layer 106 as an etch stopper to prevent exposure of the substrate 101 during etching process for formation of the first bending hole BH1, and the anti-etching layer 106 is disposed between the substrate 101 and a plurality of insulating layers 102, 103, 104 and 105 in the side area NA1 including the bending area BA where the first bending hole BH1 is to be formed.

As a result, the anti-etching layer 106 prevents the substrate 101 from being etched together with the buffer film 102, the gate insulation film 103 and the interlayer insulation film 104 during formation of the first bending hole BH1. For this reason, introduction of foreign matter is prevented, and reliability and yield of the flexible display device 100 are thus improved.

Such an anti-etching layer 106 may be formed to correspond to only the side area NA1 including the bending area BA, or to correspond to the entire region of the non-display area NA, regardless of presence of the bending area BA.

In addition, like the source electrode (114a of FIG. 2) and the drain electrode (114b of FIG. 2), links LK are formed on the interlayer insulation film 104.

As described above, the gate line GL is formed on the gate insulation film 103 together with the gate electrode (113 of FIG. 2). The link LK corresponding to the gate line GL is connected to the gate line GL through the link hole LKH which passes through the interlayer insulation film 104 to expose at least a part of the gate line GL.

In addition, the data line (DL of FIG. 1) is formed on the interlayer insulation film 104. In this case, an additional contact hole to connect the data line DL to the link LK is unnecessary. That is, the link LK corresponding to the data line DL may extend from the data line DL.

The protective film 105 is formed over the entire surface of the interlayer insulation film 104 such that the protective film 105 covers the source electrode 114a and the drain electrode 114b, the first bending hole BH1 and the links LK.

The pads PD are formed on the protective film 105 and are connected to the respective links LK through the pad holes PDHs which passes through the protective film 105 to expose at least a part of the link LK.

Meanwhile, at least a part of the anti-etching layer 106 is bent together with the bending area BA of the substrate 101, therefore a material for the anti-etching layer 106 is softer than the inorganic insulating material selected as a material for the buffer film 102, the gate insulation film 103 and the interlayer insulation film 104. In addition, upon formation of the first bending hole BH1, so as to minimize etching of the anti-etching layer 106 together with the gate insulation film 103 and the interlayer insulation film 104, the material for the anti-etching layer 106 preferably has an etch ratio lower than the gate insulation film 103 and the interlayer insulation film 104.

The material for the anti-etching layer 106 satisfying these conditions may be an insulating material such as amorphous silicon (a-Si). Alternatively, the material may be a conductive metal material such as ITO, Mo or Ti, which is advantageous in terms of process cost, easiness and universality.

Furthermore, the links LK contact at least a part of the anti-etching layer 106 exposed through the first bending hole BH1. For this reason, the links LK are disadvantageously short-circuited through the anti-etching layer 106, when the anti-etching layer 106 is formed of a conductive material and is provided as a single pattern.

As shown in FIGS. 4 and 6, the anti-etching layer 106 includes a plurality of anti-etching, patterns 106a and 106b corresponding to the respective links LK. Here, the anti-etching patterns 106a and 106b are provided as independent patterns that are not connected to each other to prevent the links LK from being connected to one another by the anti-etching layer 106.

When the anti-etching layer 106 is provided as the anti-etching patterns 106a and 106b, the first bending hole BH1 may include a plurality of first bending holes such that the first bending holes expose at least a part of each of the anti-etching patterns 106a and 106b. That is, the flexible display device 100 includes the plurality of the first bending holes Bill corresponding to the plurality of the anti-etching patterns 106a and 106b.

The links LK are formed such that the links ILK one-on-one contact the anti-etching patterns 106a and 106b at least a part of each of which is exposed through the first bending holes Bill. As a result, it is possible to prevent short circuit between the links LK caused by the anti-etching layer 106.

As described above, the flexible display device 100 according to the first embodiment of the present invention includes a first bending hole BH1. The first bending hole is formed by removing the buffer film 102, the gate insulation film 103 and the interlayer insulation film 104 to expose the anti-etching layer 106 in the bending area BA. As a result, it is possible to prevent breakage (disconnection) defects of the link LK caused by diffusion of cracks which may develop in the inorganic insulating material due to application of bending stress, wherein the inorganic insulating material is used to form the buffer film 102, the gate insulation film 103 and the interlayer insulation film 104.

The flexible display device 100 further includes the anti-etching layer 106. The anti-etching layer 106 is disposed between the substrate 101 and the buffer film 102 in a region Where the first bending hole BH1 is formed and the neighboring region thereof. Materials used for the anti-etching layer 106 may have lower etching rates than materials used for the buffer film 102, the gate insulation film 103 and the interlayer insulation film 104. Consequently, the anti-etching layer 106 enables to prevent etching of the substrate 101, in a case in which etching for formation of the first bending hole BH1 is continuously performed under over-etching conditions even after removal of the buffer film 102, the gate insulation film 103 and the interlayer insulation film 104. As a result, it is possible to prevent generation of foreign matter caused by unsuitable etching of the substrate 101, thus preventing defects caused by the foreign matter and improving reliability and yield.

Next, the flexible display device according to the second embodiment of the present invention will be described with reference to FIGS. 7 and 8.

Figure 7:
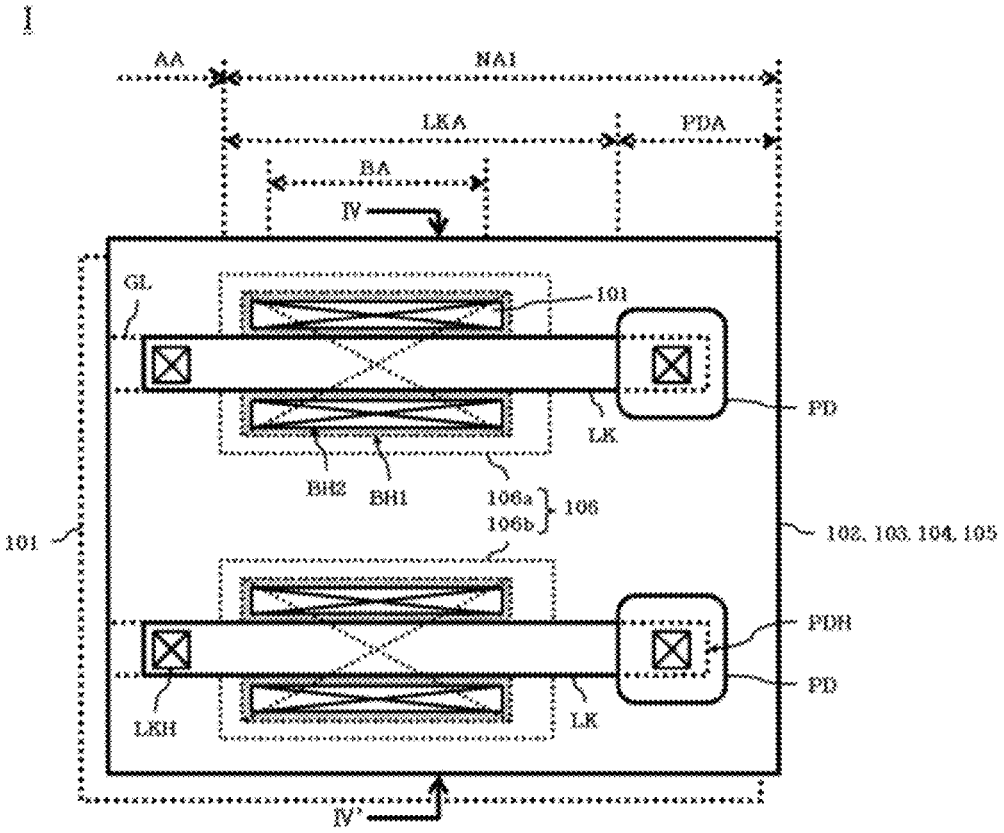
FIG. 7 is a plan view illustrating a part I of FIG. 1 according to the second embodiment of the present invention in more detail.

FIG. 7 is a plan view illustrating the part I of FIG. 1 according to the second embodiment of the present invention in more detail. FIG. 8 is a sectional view illustrating the part IV-IV' of FIG. 7.

Figure 8:
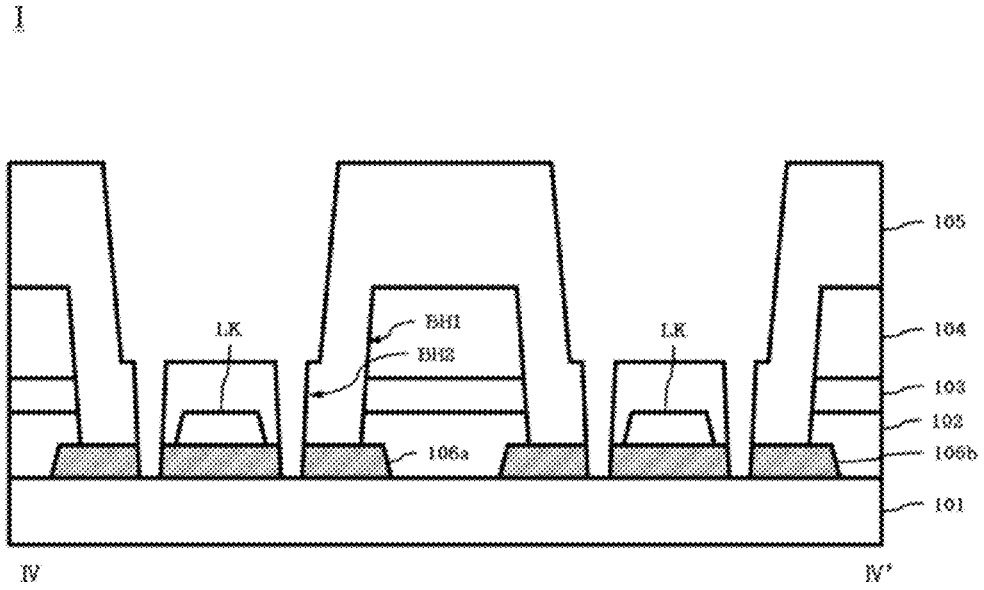
FIG. 8 is a sectional view illustrating a part IV-IV' of FIG. 7.

As shown in FIGS. 7 and 8, the flexible display device according to the second embodiment further includes at least one second bending hole BH2. The second bending hole BH2 is formed in the periphery of the link LK in each first bending hole BH1. The other portions are the same as the flexible display device of the first embodiment shown in FIGS. 1 to 6. An overlapping description thereof is thus omitted below.

Each second bending hole Bin shown in FIGS. 7 and 8 is used for removal of bending stress factors, that is, the protective film 105 and the anti-etching layer 106 left in the periphery of the link LK in the first bending hole BH1. In other words, each second bending hole BH2 passes through the protective film [106] *105* and the anti-etching layer 106 in the periphery of the link LK in the first bending hole BH1 to expose a part of the substrate 101.

As a result, when the protective film 105 and the anti-etching layer 106 are removed by formation of the second bending hole BH2 in a portion of the bending area BA, excluding the periphery of the link LK, bending stress factors are further reduced and defects caused by bending stress can thus be further prevented.

Next, the third embodiment of the present invention will be described with reference to FIG. 9.

Figure 9:
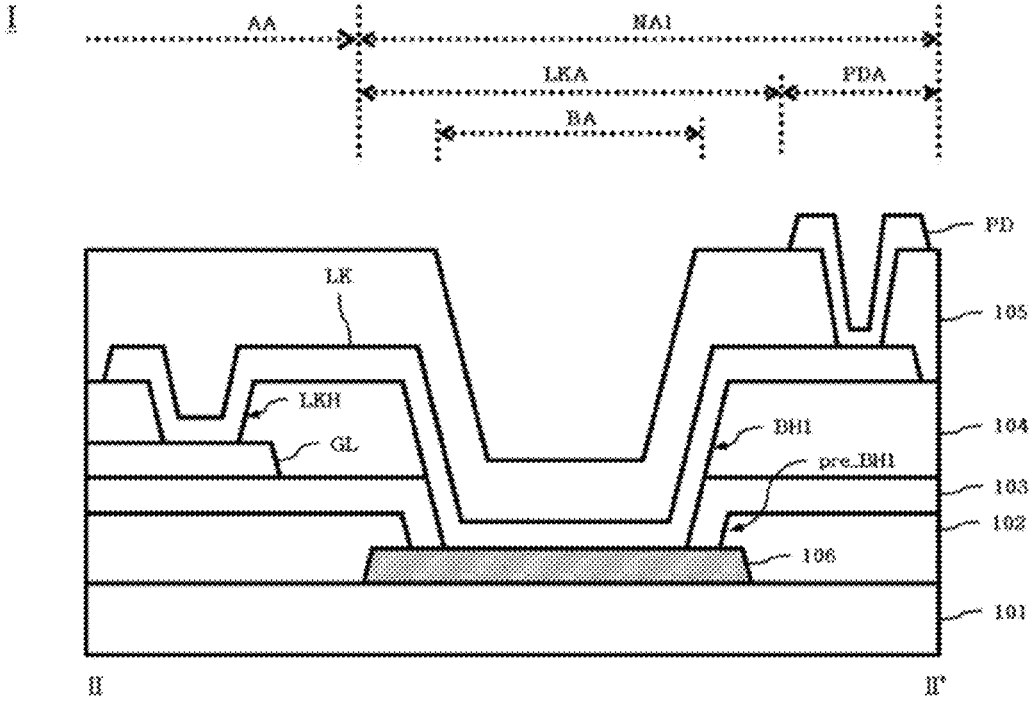
FIG. 9 is a sectional view illustrating a part II-II' of FIG. 4 according to the third embodiment of the present invention.

FIG. 9 is a sectional view illustrating the part IMF of FIG. 4 according to the third embodiment of the present invention.

As shown in FIG. 9, the flexible display device according to the third embodiment further includes a pre-bending hole pre_BH1. The pre-bending hole pre_BH1 is formed after formation of the buffer film 102 and before formation of the active layer 111 to correspond to the bending area BA and to pass through the buffer film 102 in a width greater than the first bending hole BH1. The other portions are the same as that of the first or second embodiment. An overlapping description thereof is thus omitted below.

Forming the pre-bending hole pre_BH1 shown in FIG. 9 results in removing the buffer film 102 in the bending area prior to the formation of the first bending hole BH1. Accordingly, it is not necessary to remove the buffer film 102 anymore in forming the first bending hole BH1, but to remove only the gate insulation film 103 and the interlayer insulation film 104. Meanwhile, the source hole SH and the drain hole DH pass through the gate insulation film 103 and the interlayer insulation film 104, like the first bending hole BH1 of the present embodiment. Damage to the active layer 111 exposed due to the formation of the source hole SH and the drain hole DH caused by over-etching during the formation of the first bending hole BH1 can thus be minimized.

Next, the flexible display device according to the fourth embodiment of the present invention will be described with reference to FIGS. 10 and 11.

Figure 10:
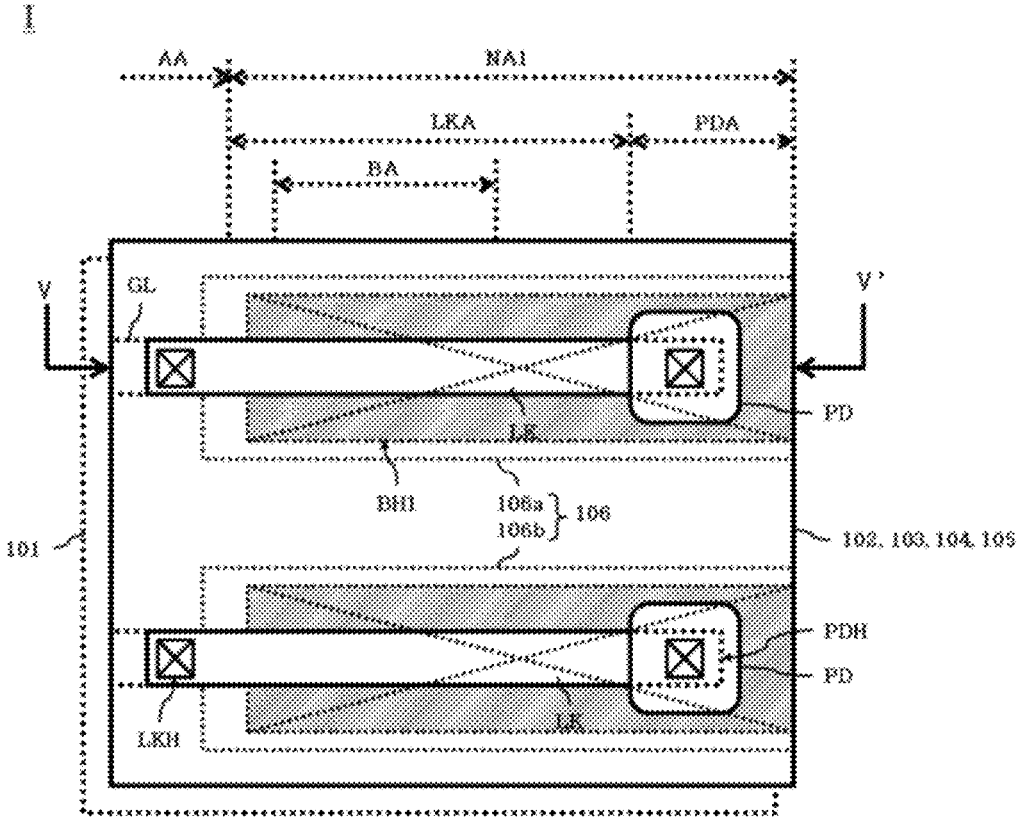
FIG. 10 is a plan view illustrating the part I of FIG. 1 according to the fourth embodiment of the present invention ore detail.

FIG. 10 is a plan view illustrating the part I of FIG. 1 according to the fourth embodiment of the present invention in more detail. FIG. 11 is a sectional view illustrating the part V-V' of FIG. 10.

Figure 11:
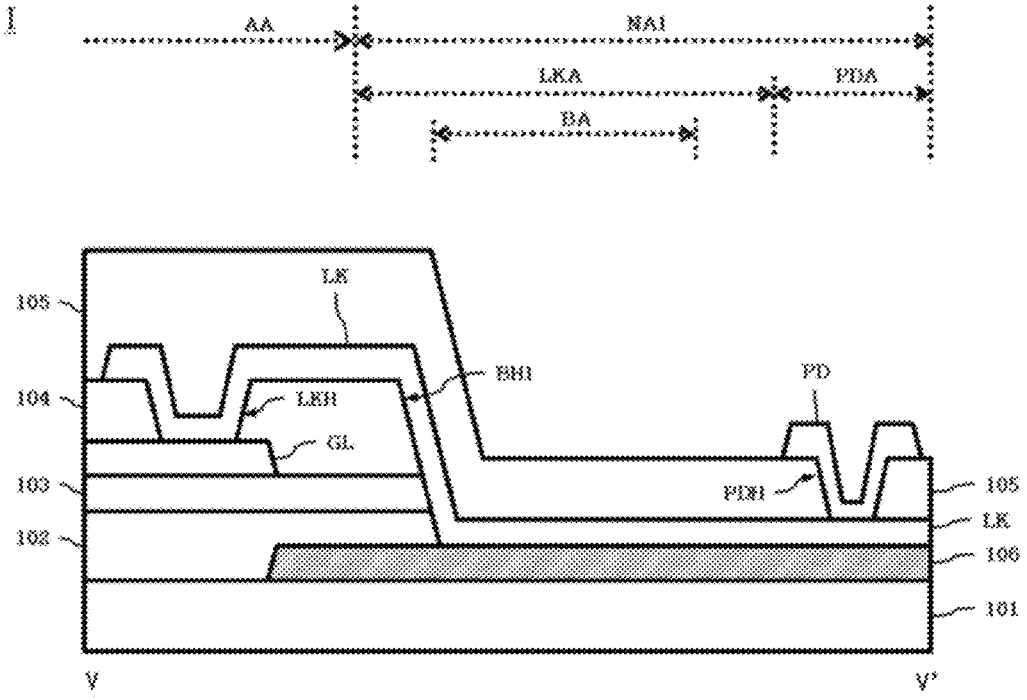
FIG. 11 is a sectional view illustrating a part V-V' of FIG. 10.

As shown in FIGS. 10 and 11, the flexible display device of the fourth embodiment is configured to form the first bending hole BH1 and the anti-etching layer 106 further in the pad area PDA as well as the bending area BA. The other portions are the same as those of the first to third embodiments. An overlapping description thereof is thus omitted below.

Next, a method for manufacturing the flexible display device according to the first embodiment of the present invention will be described with reference to FIGS. 12, 13, 14a to 14c, 15a to 15g, and 16a and 16b.

Figure 12:
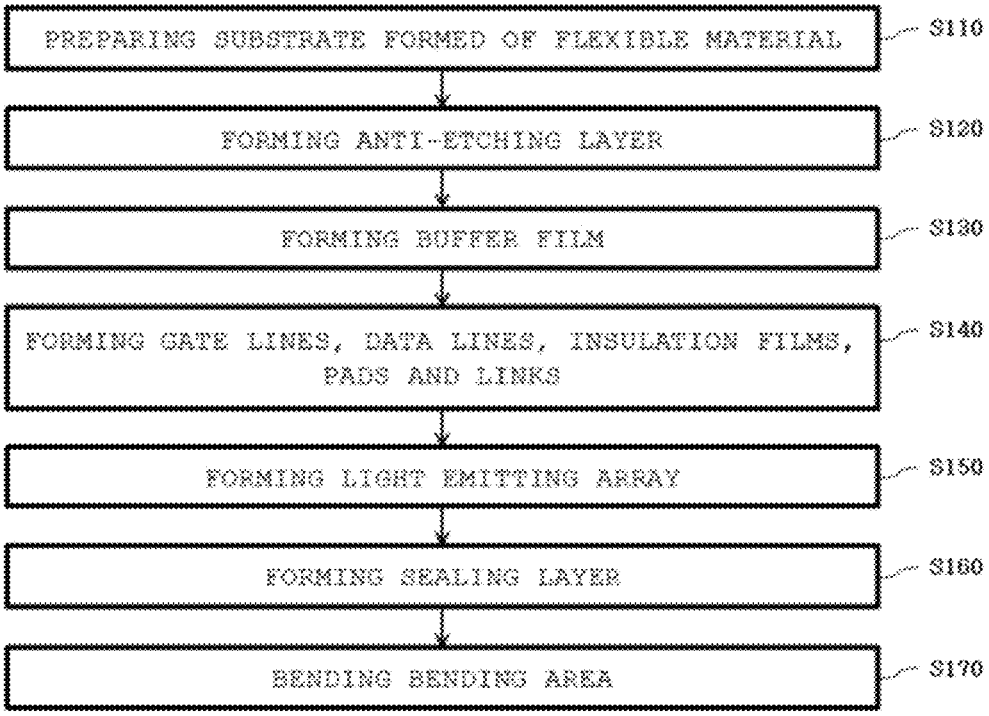
FIG. 12 is a flowchart illustrating a method for manufacturing the flexible display device according to the first embodiment of the present invention.

FIG. 12 is a flowchart illustrating a method for manufacturing the flexible display device according to the first embodiment of the present invention. As shown in FIG. 12, the method for manufacturing the flexible display device according to the first embodiment includes: preparing, at step S110, a substrate 101 formed of a flexible material and including a display area AA and a non-display area NA1 which is an outer region of the display area AA and includes a link area LKA and a pad area PDA; forming, at step S120, an anti-etching layer 106 in at least a part of the non-display area NA1 on the substrate 101; forming, at step S130, a buffer film 102 over the entire surface of the substrate 101.

The method further includes: forming, at step S140, (1) gate lines GL and data lines DL on the buffer film 102 in the display area AA; (2) a plurality of insulation films on the entire surface of the buffer film 102; (3) a first bending hole BH1 in the bending area BA of the non-display area NA1; (4) a plurality of pads PD in the pad area FDA of the nondisplay area NA1; and (5) a plurality of links LK in the link area of the non-display area NA1, At the above step S140, the first bending hole is configured to passes through at least one of a plurality of insulation films in the bending area of the non-display area. The bending area is configured to be bent such that the pad area is disposed on the lower surface of the substrate. The plurality of pads is configured to be connected to an exterior circuit to supply a driving signal to any one signal line of the gate line and the data line. The plurality of links is configured to connect respective pads with the signal lines.

The method further includes: forming, at step S150, a light emitting array including a plurality of light emitting elements EL in respective pixel areas PA; forming, at step S160, a sealing layer 130 in the display area AA. The sealing layer 130 seals the light emitting elements EL such that the sealing layer 130 faces the substrate 101 via the light emitting elements EL; and bending, at step S170, a bending area BA such that the pads PD are disposed on the lower surface of the substrate 101.

Figure 13:
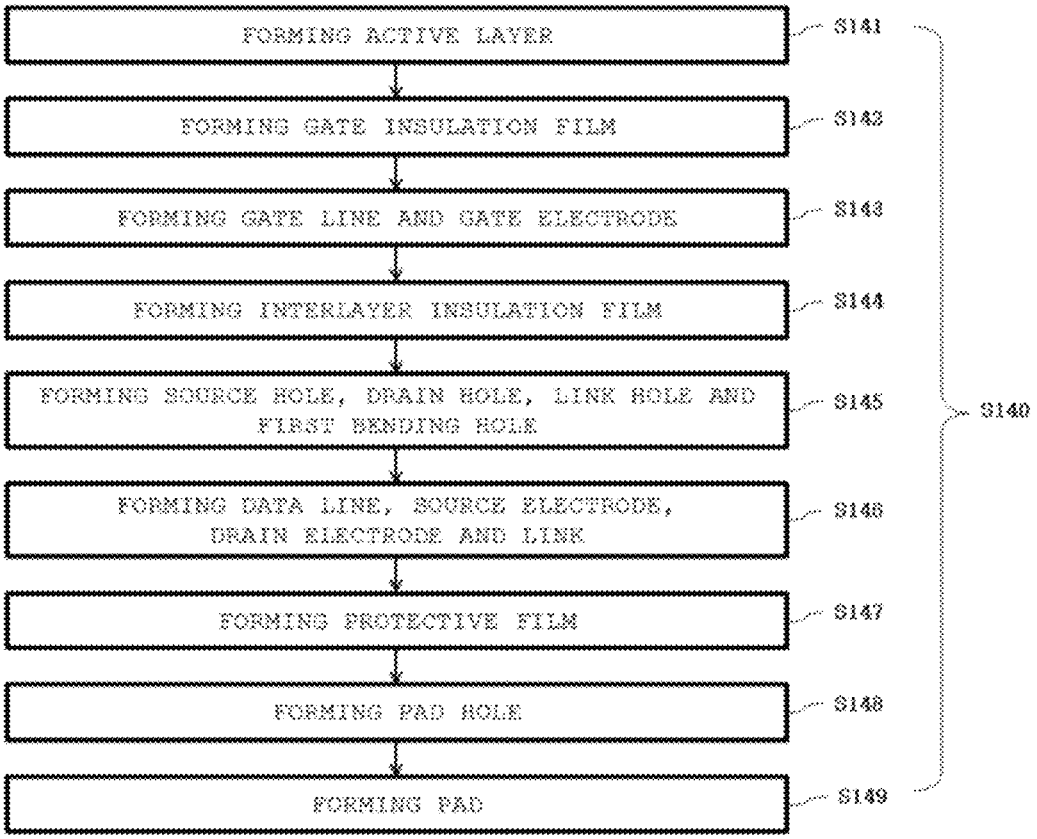
FIG. 13 is a flowchart illustrating formation of a cell array, links and pads.

FIG. 13 is a flowchart illustrating formation of a cell array, links and pads, as shown in FIG. 13, formation of the gate lines GL and the data lines DL, the insulation films, the first bending hole BH1, the pads PD and the links LK executed at step S140 includes: (1) forming, at step S141, an active layer 111 in a part of each pixel area PA on the buffer film 102; (2) forming, at step S142, a gate insulation film 103 over the entire surface of the buffer film 102; (3) forming, at step S143, gate lines GL and gate electrodes 113 connected thereto on the gate insulation film 103; (4) forming, at step S144, an interlayer insulation film 104 over the entire surface of the gate insulation film 103; (5) forming, at step S145, a source hole SH, a drain hole DH, a link hole LKH and the first bending hole BH1, wherein each of the source hole, the drain hole and the link hole passes through the interlayer insulation film 104 and the gate insulation film 103, and wherein the first bending hole BH1 passes through the interlayer insulation film 104, the gate insulation film 103 and the buffer film 102; (6) forming, at step S146, the data lines DL, the source electrode 114a, the drain electrode 114b and the links LK on the interlayer insulation film 104; (7) forming, at step S147, a protective film 105 over the entire surface of the interlayer insulation film 104; (8) forming, at step S148, a pad hole PDH passing through the protective film 105; and (9) forming at step S149, the pads PD on the protective film 105.

Figure 14A:
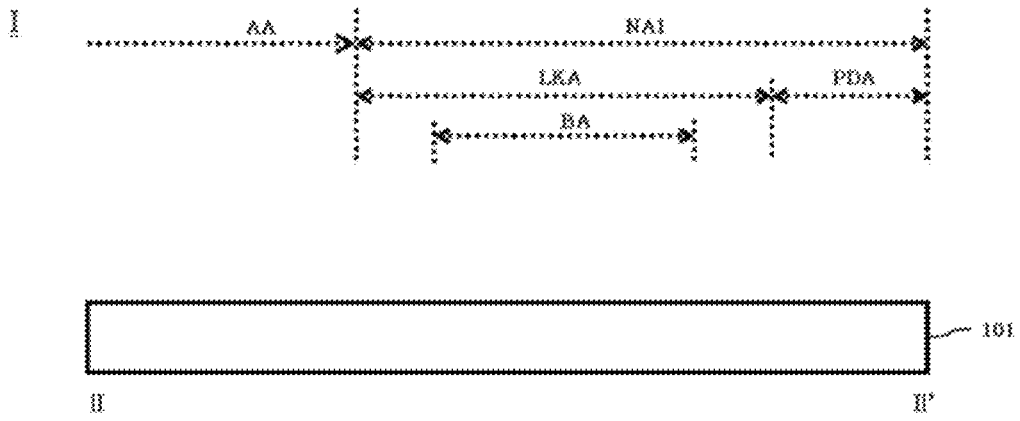

FIG. 14a illustrates a first process of a method for manufacturing the flexible display device. As shown in FIG. 14a, a substrate 101 formed of a flexible material is prepared (S110). For this purpose, a sacrificial substrate (not shown) may be used.

Figure 14B:
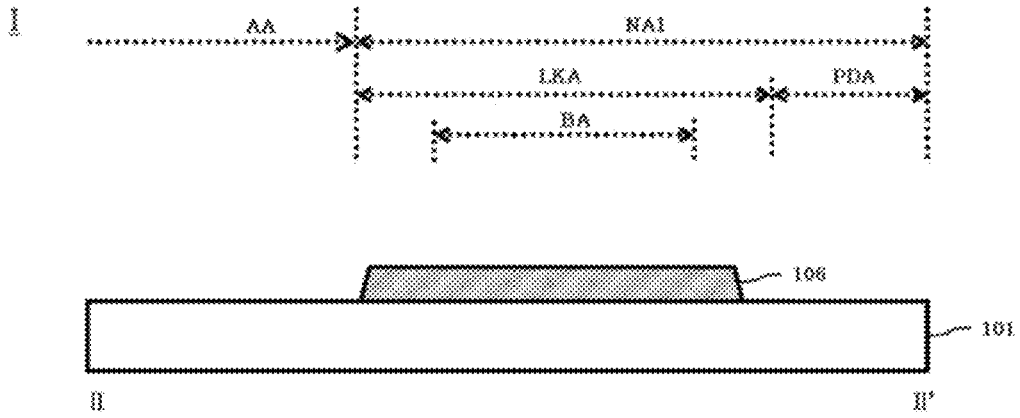

FIG. 14b illustrates a second process of a method for manufacturing the flexible display device. As shown in FIG. 14b, an anti-etching layer 106 is formed in at least a part of the non-display area NA including the bending area BA on the substrate 101 (S120).

The anti-etching layer 106 may be formed in the entirety of the non-display area NA, or only in at least one of selected side area of the non-display area NA, including the later-formed first bending hole (Bill of FIGS. 4 to 6).

The anti-etching layer 106 includes the bending area BA and is thus bent together with the substrate 101. Although the etching process to form the first bending hole BH1 is performed under over-etching conditions, it is necessary to prevent exposure of the substrate during etching and generation of foreign matter caused by the anti-etching layer 106. Accordingly, a material for the anti-etching layer 106 may be selected from materials having a higher softness in other words, lower hardness) and a lower etch ratio than each of inorganic insulating materials for at least one of the later-formed buffer film 102, gate insulation film 103 and interlayer insulation film 104.

For example, a material for the anti-etching layer 106 is selected from ITO, Mo, Ti and a-Si which are advantageous in terms of process cost, easiness and universality.

Furthermore, because the plurality of links (LK of FIGS. 1 and 5) connected to the anti-etching layer 106 through the first bending hole BH1, in a case in which the anti-etching layer 106 is formed of a conductive material, the links LK may be short-circuited through the anti-etching layer 106. To prevent this, the anti-etching layer 106 is provided as a plurality of anti-etching patterns (106a and 106b of FIGS. 4, 6-8 and 10) that correspond to a plurality of links LK and are separated from one another.

Figure 14C:
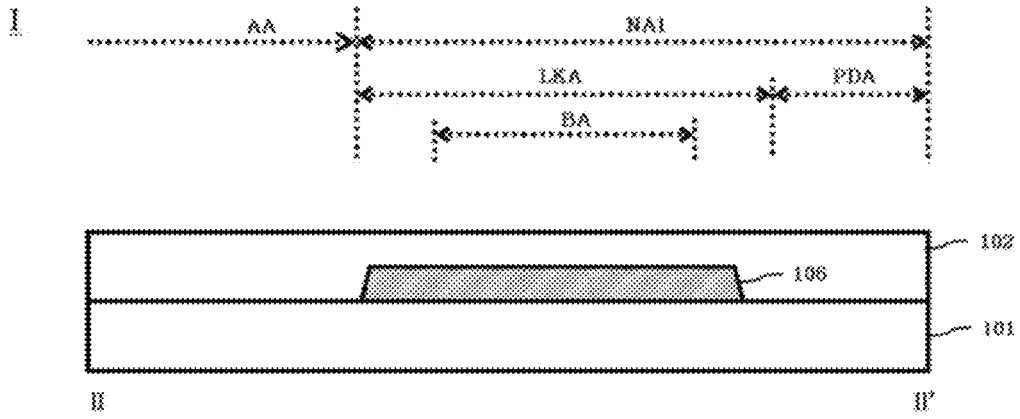

FIG. 14c illustrates a third process of a method for manufacturing the flexible display device. As shown in FIG. 14c, a buffer film 102 is formed over the entire surface of the substrate 101 (S130).

Figure 15A:
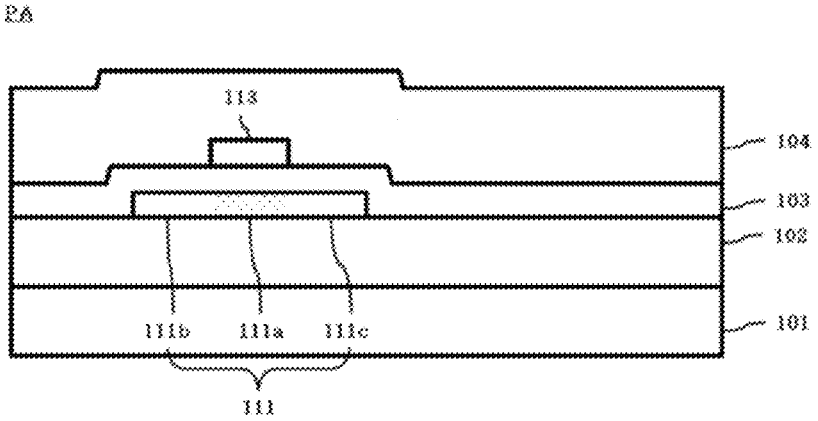

FIG. 15a illustrates a fourth process of a method for manufacturing the flexible display device. As shown in FIG. 15a, the active layer 111 is formed on the buffer film 102 (S141), and a gate insulation film 103 covering the active layer 111 is formed over the entire surface of the buffer film 102 (S142). The active layer 111 includes a channel area 111a, and a source region 111b and a drain region 111c disposed at both sides of the channel area 111a.

Then, a gate electrode 113 overlapping at least a part of a channel area of the active layer 111 and gate lines (not shown, but corresponding to GL of FIGS. 1 and 5) electrically connected to the gate electrode 113 are formed on the gate insulation film 103 (S143). Next, the interlayer insulation film 104 covering the gate electrode 113 and the gate lines GL is formed over the entire surface of the gate insulation film 103 (S144).

Figure 15B:
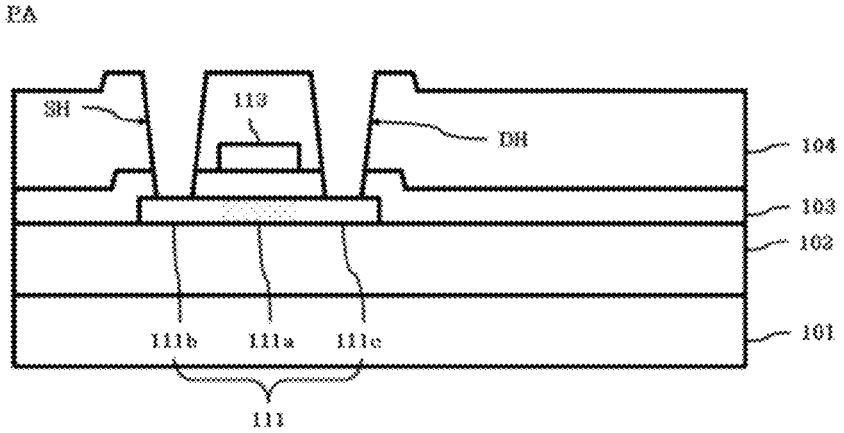
Figure 15C:
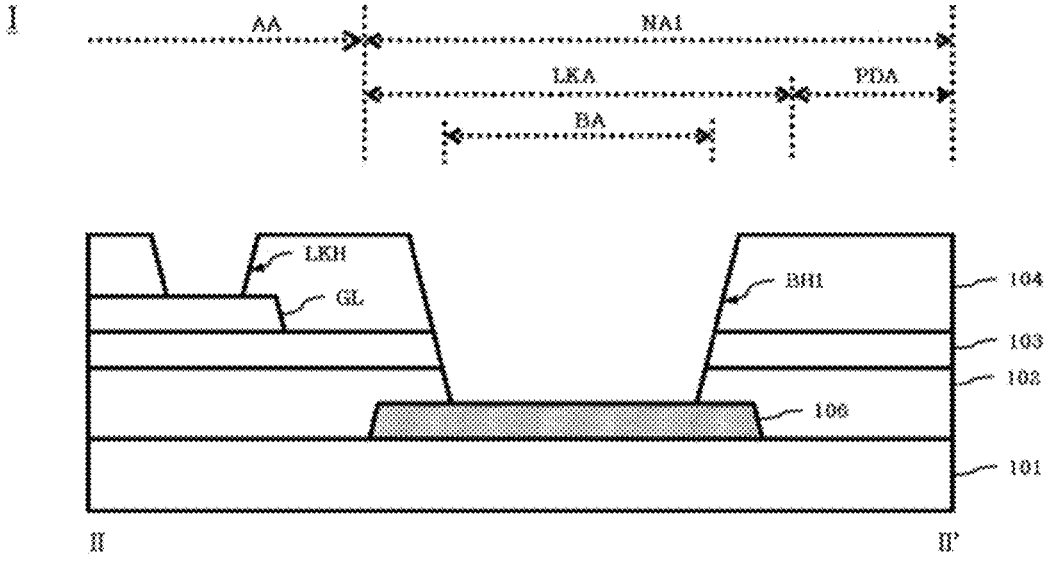

FIGS. 15b and 15c illustrate fifth and sixth processes of a method for manufacturing the flexible display device. As shown in FIG. 15b, the interlayer insulation film 104 and the gate insulation film 103 are selectively patterned to form a source hole SH, a drain hole DH. Similarly, as shown in FIG. 15c, the interlayer insulation film 104, the gate insulation film 103 and the buffer film 102 are selectively patterned to form a source hole SH, a drain hole DH, a link hole LKH and a first bending hole BH1 (S145).

The source hole SH passes through the interlayer insulation film 104 and the gate insulation film 103 to expose at least a part of the source region 111b.

The drain hole DH passes through the interlayer insulation film 104 and the gate insulation film 103 to expose at least a part of the drain region 111c.

The link hole LKH functions as a contact hole to connect the gate line GL and the links LK disposed in a layer different from the gate line GL and passes through the interlayer insulation film 104 and the gate insulation film 103 to expose at least a part of the gate line GL.

The first bending hole BH1 functions to prevent generation of cracks caused by application of greater bending stress to the buffer film 102, the gate insulation film 103 and the interlayer insulation film 104, as compared to stress applied to the substrate 101, when the bending area BA is bent. The first bending hole BH1 passes through the buffer film 102, the gate insulation film 103 and the interlayer insulation film 104, and exposes at least a part of the anti-etching layer 106 in the bending area BA.

Figure 15D:
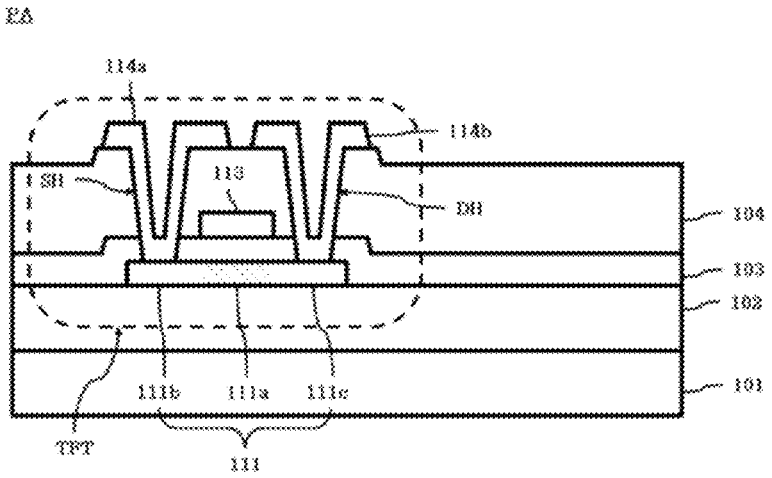
Figure 15E:
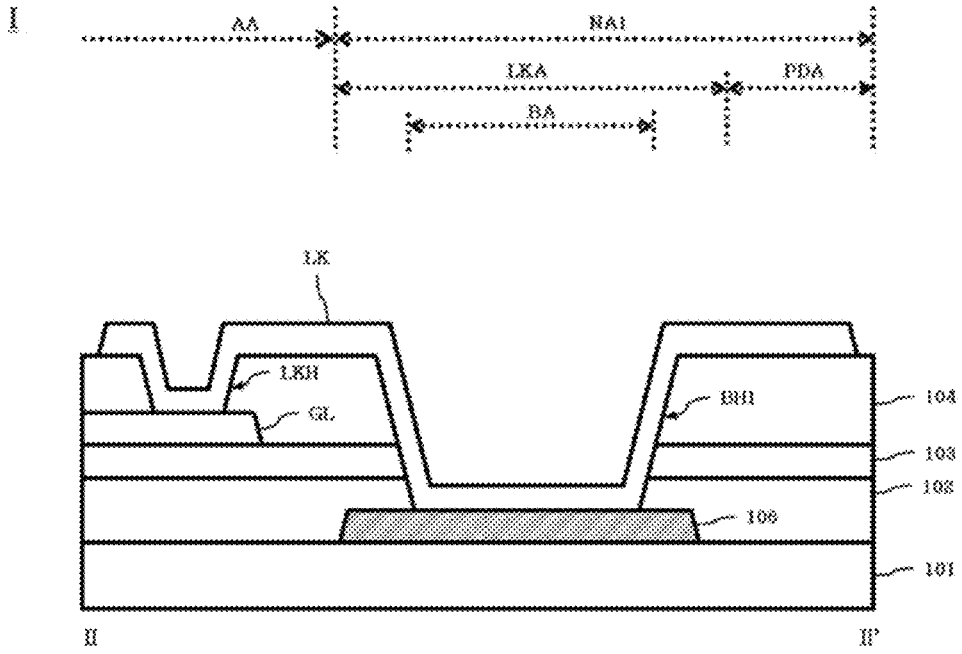

FIGS. 15b and 15c illustrate seventh and eighth processes of a method fur manufacturing the flexible display device. As shown in FIGS. 15d and 15e, the source electrode 114a, the drain electrode 114b, the data line (DL of FIG. 1), and the links LK are formed on the interlayer insulation film 104. The data line DI, is connected to one of the source electrode and the drain electrode. Each of the links LK is connected to one of the gate lines GL and the data lines DL. The links LK are formed to be extended to the pad area PDA.

The source electrode 114a is connected to the source region 111b of the active layer 111 through the source hole SH, and the drain electrode 114b is connected to the drain region 111c of the active layer 111 through the drain hole DH.

Some links LK corresponding to the gate lines GL are connected to the gate line GL, through the link hole LKH, and other links LK corresponding to the data lines DL are configured to be extended from the data line DL.

In addition, the links LK directly contact the anti-etching layer 106 through the first bending hole BH1 in the bending area BA.

When the anti-etching layer 106 is a conductive material, the links LK contact a plurality of anti-etching patterns (corresponding to 106a and 106b of FIG. 3) one-on-one through the first bending holes BH1.

Figure 15F:
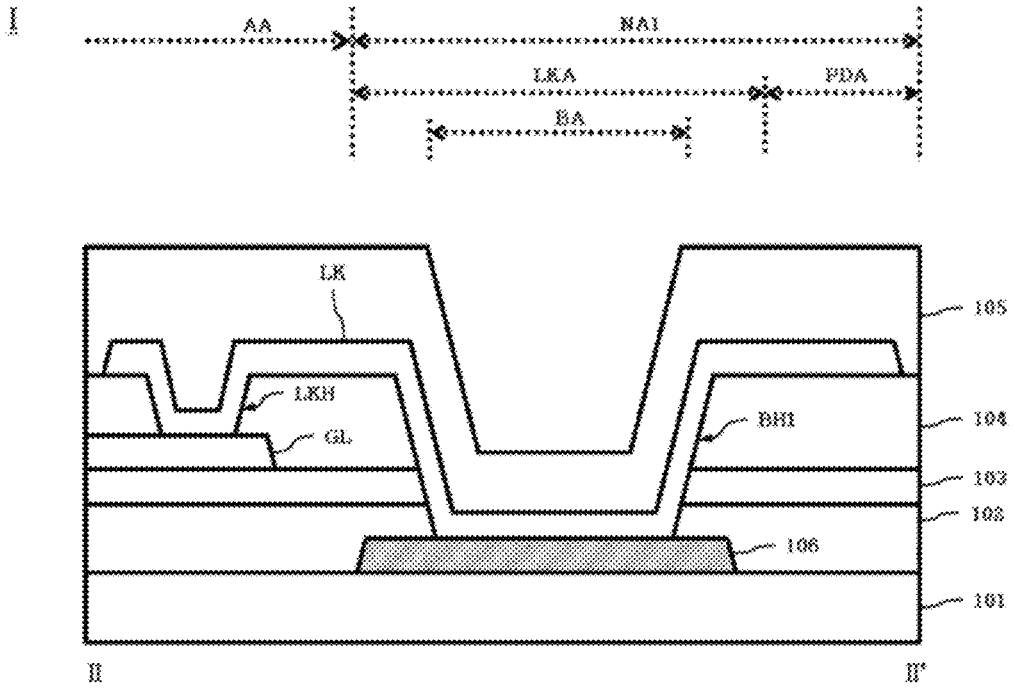

FIG. 15f illustrates a ninth process of a method for manufacturing the flexible display device. As shown in FIG. 15f, a protective film 105 covering the source electrode 114a, the drain electrode 114b, data lines DL, links LK and the first bending hole BH1 is formed over the entire surface of the interlayer insulation film 104 (S147).

Figure 15G:
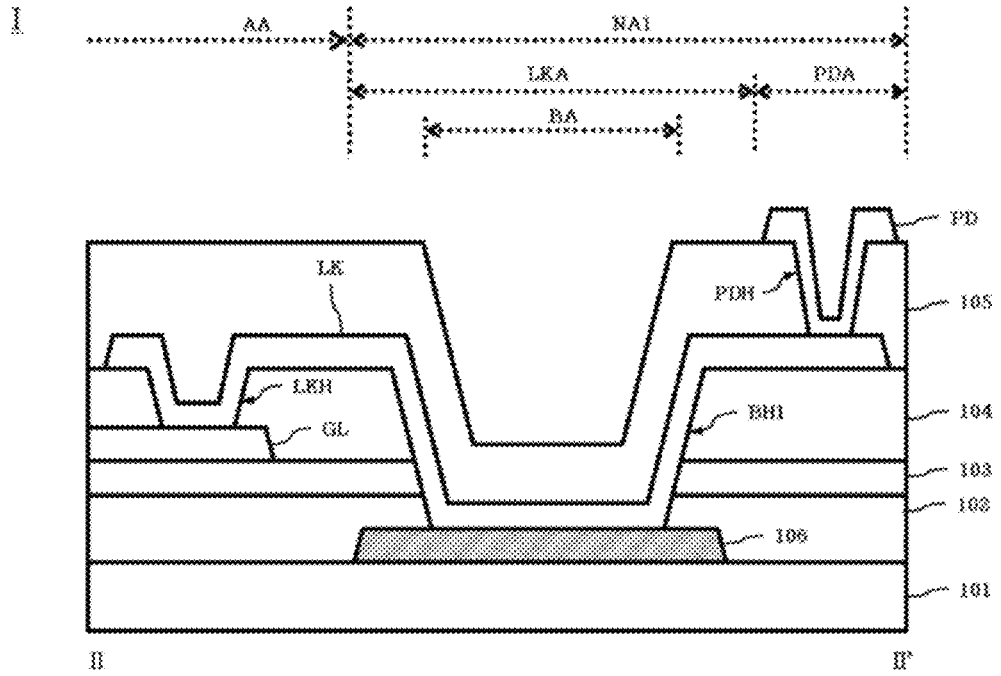

FIG. 15g illustrates a tenth process of a method for manufacturing the flexible display device. As shown in FIG. 15g, a pad hole PDH passing through the protective film 105 to expose at least a part of the link LK is formed in at least a part of the pad area PDA (S148) and a plurality of pads PD connected to a plurality of links LK one-on-one are formed on the protective film 105 (S149).

Figure 16A:
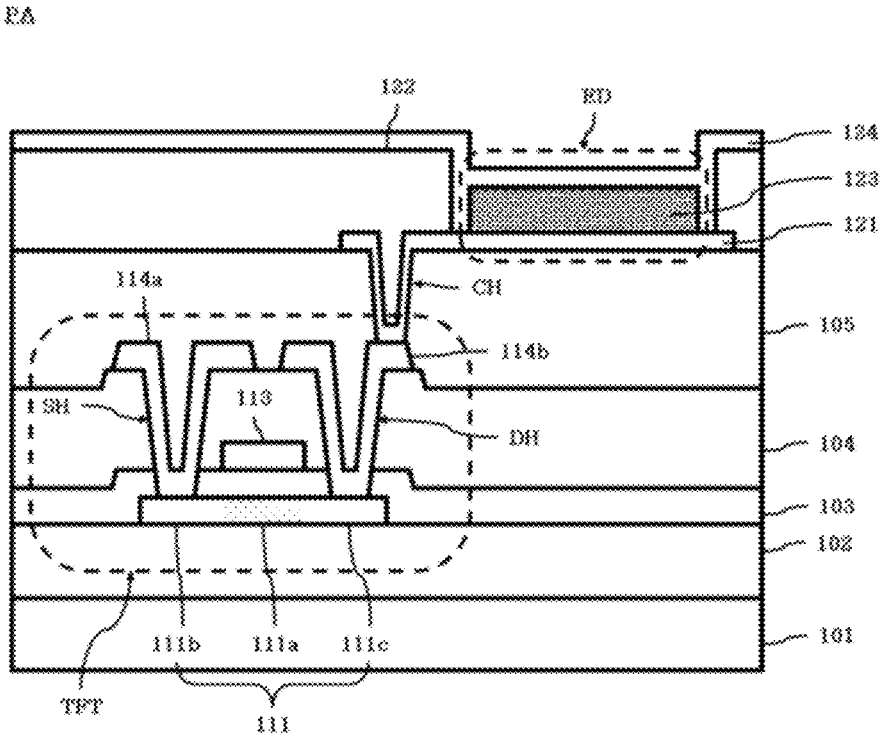

FIG. 16a illustrates an eleventh process of a method for manufacturing the flexible display device. As shown in FIG. 16a, a plurality of light emitting elements ELs is formed on the protective film 105. each of the plurality of light emitting elements ELs includes a first electrode 121, a bank 122, a light emitting layer 123 and a second electrode 124. The plurality of light emitting elements is configured to form a light emitting array corresponding to the display area (S150).

Figure 16B:
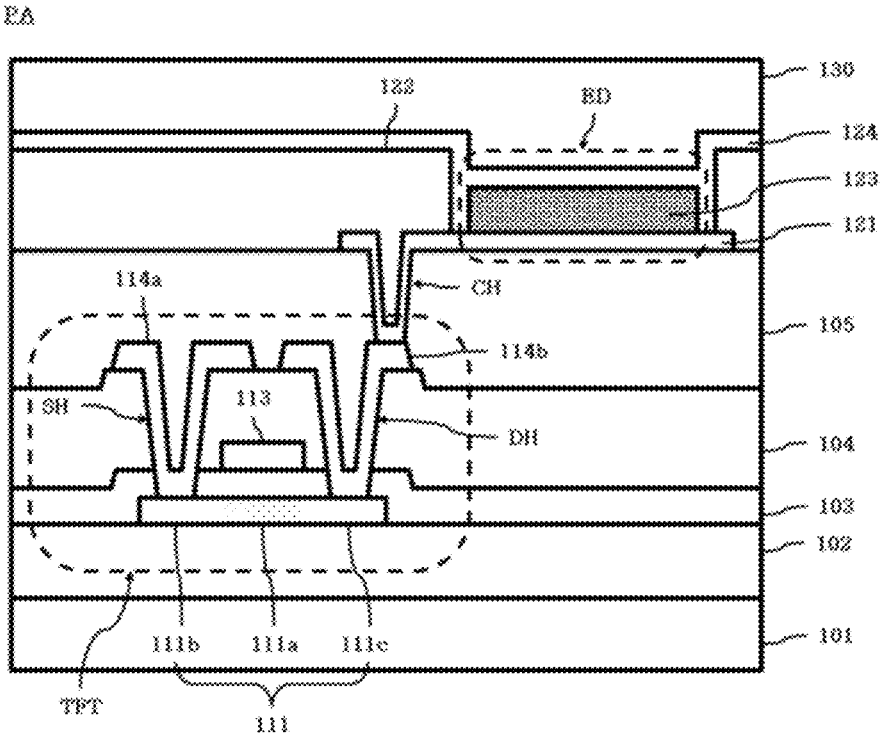

FIG. 16b illustrates a twelfth process of a method for manufacturing the flexible display device. As shown in FIG. 16b, a sealing layer 130 is formed in the display area AA to face the substrate 101 via the light emitting element EL. The sealing layer is formed to seal the light emitting element EL (S160).

Although not illustrated, a method for the flexible display device according to the fourth embodiment of the present invention (corresponding to FIGS. 10 and 11) is the same as in FIG. 14b, except that, during formation of the anti-etching layer 106 (S120), the anti-etching layer 106 is further formed in the pad area PDA as well as the bending area BA. In addition, the method for manufacturing the flexible display device according to the fourth embodiment is the same as in FIG. 15c, except that, during formation of the source hole SH, the drain hole DH, the link hole LKH and the first bending hole BH1 (S145), the first bending hole BH1 is further formed in the pad area PDA as well as in the bending area BA and an overlapping description thereof is thus omitted below.

As shown in FIG. 3, the bending area BA is bent and the pads PD are disposed on the lower surface of the substrate 101 (S170).

Meanwhile, although not illustrated in FIG. 12, FIGS. 14a to 14c, FIGS. 15a to 15g, and FIGS. 16a and 16b in detail, a sacrificial substrate (not shown) may be used during preparation of the substrate 101 (S110). That is, the preparation of the substrate 101 may be carried out by laminating a flexible material on the sacrificial substrate (not shown). In this case, the method for manufacturing the flexible display device further includes removing the sacrificial substrate (not shown) after formation of the sealing layer 130 (S160), and before bending the bending area BA of the substrate 101 (S170).

A method for manufacturing the flexible display device according to the second embodiment will be described with reference to FIG. 17.

Figure 17:
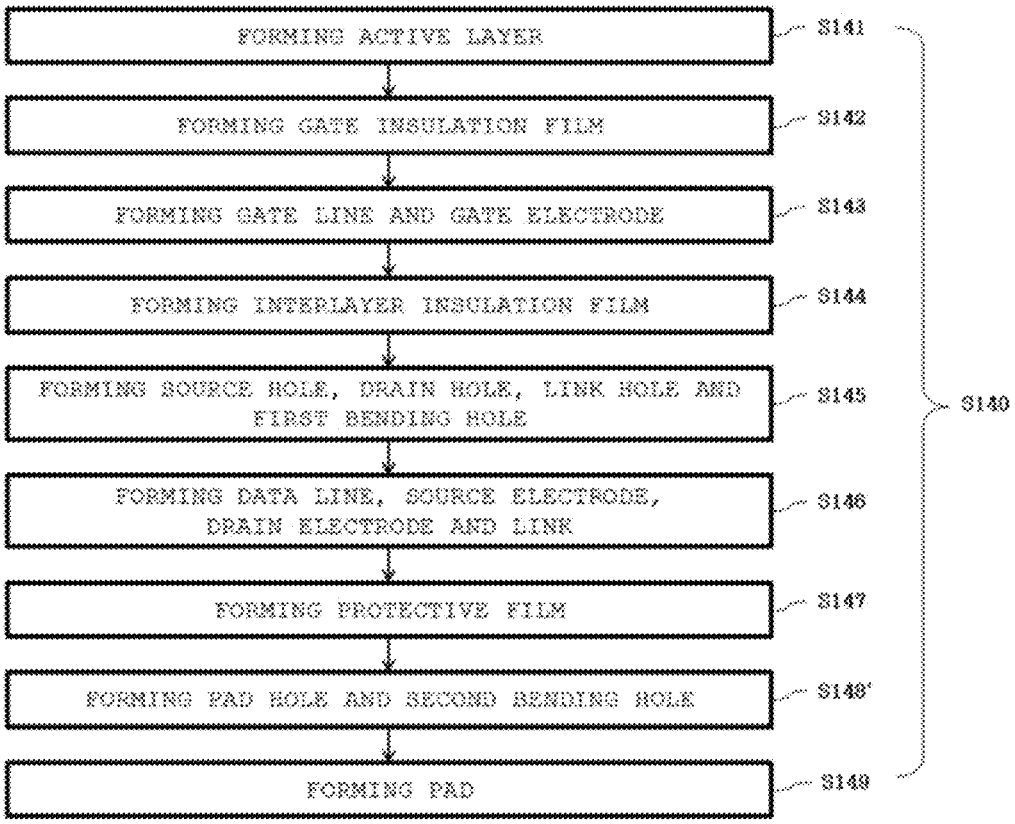
FIG. 17 is a flowchart illustrating a method for manufacturing the flexible display device according to the second embodiment of the present invention.

FIG. 17 is a flowchart illustrating the method for manufacturing the flexible display device according to the second embodiment.

As shown in FIG. 17, the method for manufacturing the flexible display device according to the second embodiment further forms at least one second bending hole BH2 during formation of the pad hole (S148'). The other portions are the same as the first embodiment described above An overlapping description thereof is thus omitted below.

Referring to FIGS. 7 and 8, the second bending hole BH2 passes through the protective film 105 and the anti-etching layer 106, and exposes a part of the substrate 101 in the periphery of the link LK in the first bending hole BM.

The further addition of the second bending hole BH2 enables further removal of the protective film 105 and the anti-etching layer 106 disposed in the periphery of the link LK in the bending area BA, further reduction of the bending stress factor and improvement in reliability and yield of the flexible display device.

Next, referring to FIGS. 18 and 19, a method for manufacturing the flexible display device according to the third embodiment of the present invention and the flexible display device manufactured by the method will be described.

Figure 18:
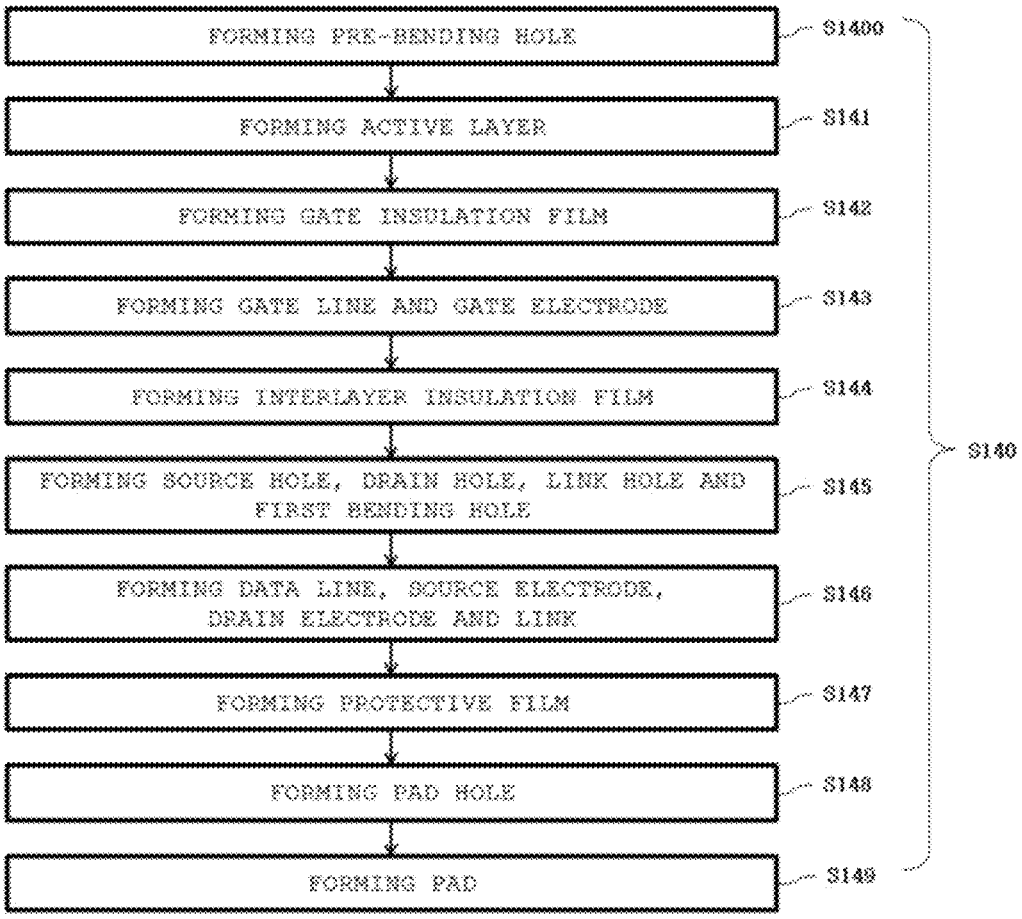
FIG. 18 is a flowchart illustrating a method for manufacturing the flexible display device according to the third embodiment of the present invention.

FIG. 18 is a flowchart illustrating a method for manufacturing the flexible display device according to the third embodiment of the present invention. FIG. 19 is a view illustrating a process for forming the pre-bending hole of FIG. 18.

As shown in FIG. 18, the method for manufacturing the flexible display device according to the third embodiment of the present invention further includes forming the pre-bending hole (pre_BH1) before formation of the active layer (S1400). The other portions are the same as the first embodiment described above. An overlapping description thereof is thus omitted below.

Figure 19:
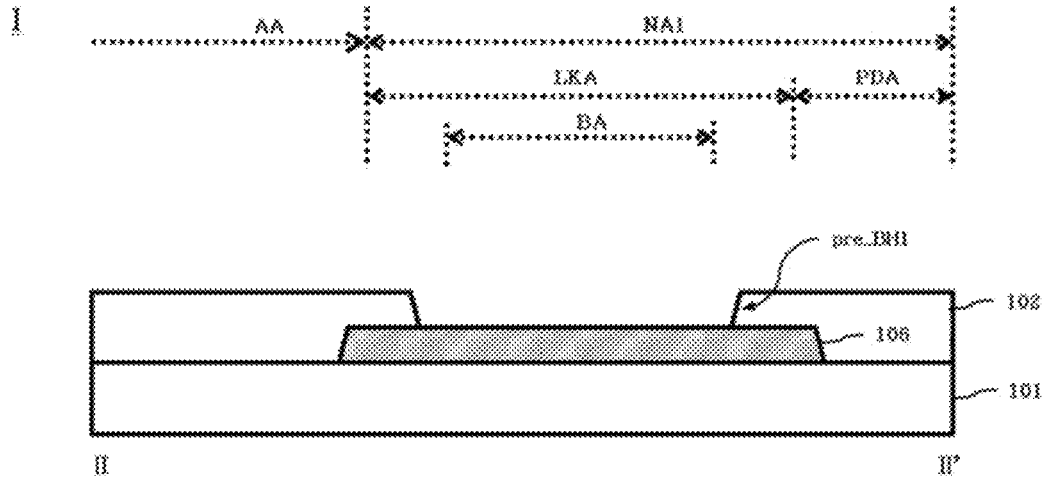
FIG. 19 is a view illustrating a process for forming a pre-bending hole in FIG. 18.

As shown in FIG. 19, after formation of the buffer layer 102 (S130 of FIG. 12) and before formation of the active layer 111 (S141), a pre-bending hole pre_BH1 is formed in the bending area BA (S1400). The pre-bending hole pre_BH1 is configured to pass through the buffer layer 102 such that the pre-bending hole pre_BH1 exposes at least a part of the anti-etching layer 106 (S1400).

When the method further includes the pre-bending hole pre_BH1 (S1400), at the step of forming of the source hole SH, the drain hole DH, the link hole LKH and the first bending hole BH1 (S145), the etching of the buffer film 102 which has been carried out only for formation of the first bending hole BH1 becomes unnecessary, consequently, it is possible to prevent the source hole SH, the drain hole DH, and the link hole LKH from being excessively etched while the buffer film 102 is completely patterned to form the first bending hole BH1. As a result, it is possible to reduce damage to the source region 111b, the drain region 111c and the gate line GL by the source hole SH, the drain hole DH and the link hole LKH, respectively.

The flexible display device according to the embodiments of the present invention can reduce a width of a bezel without reducing a width of the non-display area, since the plurality of pads are disposed on the lower surface of the substrate by bending the bending area. Accordingly, the display devices have improved product values associated with aesthetics and usability.

The flexible display device includes the first bending hole, thus enabling removal of parts of each the buffer film, the gate insulation film and the interlayer insulation film which correspond to the bending area. As a result, it is possible to prevent problems such as application of relatively greater bending stress to the buffer film, the gate insulation film and the interlayer sulation film than bending stress to the substrate, when the bending area is bent, generation of cracks and thus breakage (disconnection) of links (wiring). As a result, it is possible to improve reliability and yield of the display device.

In addition, the flexible display device fluffier includes an anti-etching layer between the substrate and the buffer film in a part of the non-display area, that is, in a region including the first bending hole, thus preventing the substrate from being etched by an etching process to form the first bending hole. As a result, it is possible to prevent permeation of foreign matter causing defects and thereby improve reliability and yield of the display device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

[1. A method for manufacturing a flexible display device comprising:

forming a substrate defined by a display area and a non-display area being an outer region of the display area and including a link area and a pad area, using a flexible material;

forming a buffer film over the surface of the substrate;

forming a gate insulation film over the surface of the buffer film;

forming gate lines in the display area on the gate insulation film;

forming an interlayer insulation film over the entire surface of the gate insulation film such that the interlayer insulation film covers the gate lines;

forming a first bending hole passing through at least the gate insulation film and the interlayer insulation film in a bending area, wherein the bending area bends such that the pad area of the non-display area is disposed on the lower surface of the substrate;

forming data lines and a plurality of links, wherein the data lines are formed in the display area on the interlayer insulation film such that the data lines cross the gate lines, and wherein the plurality of links are connected to signal lines selected from the gate lines and the data lines in the linking area on the interlayer insulation film;

forming a protective film over the surface of the interlayer insulation film such that the protective film covers the data lines and the links;

forming a plurality of pads connected to the links and connected to an exterior circuit to supply a driving signal to the signal line on the protective film; and bending the bending area such that the pads are disposed on the back side of the surface of the substrate.]

[2. The method according to claim 1, further comprising: forming an anti-etching layer in at least a part including the bending area of the non-display area on the substrate, before formation of the buffer film, wherein the first bending hole further passes through the buffer film to expose at least a part of the anti-etching layer, during formation of the first bending hole, and the link directly contacts at least a part of the anti-etching layer exposed through the first bending hole in the bending area, during formation of the link.]

[3. The method according to claim 2, further comprising forming at least one second bending hole passing through the protective film and the anti-etching layer in the periphery of the link in the first bending hole to expose a part of the substrate, after formation of the protective film.]

[4. The method according to claim 2, wherein the anti-etching layer is further formed in the pad area during formation of the anti-etching layer, and the first bending hole is further formed in the pad area during formation of the first bending hole.]

[5. The method according to claim 2, wherein, during formation of the anti-etching layer, the anti-etching layer is formed using a material having softness higher than the insulation films and having an etch ratio lower than the insulation films upon etching to form the first bending hole.]

[6. The method according to claim 2, wherein, during formation of the anti-etching layer, the anti-etching layer is formed using at least one of ITO, Mo, Ti, Cu, Ag, Au and a-Si.]

[7. The method according to claim 2, wherein the anti-etching layer includes a plurality of anti-etching patterns corresponding to the links, during formation of the anti-etching layer, and the first bending hole includes a plurality of first bending holes to expose at least a part of the respective anti-etching patterns during formation of the first bending hole, and The links contact the anti-etching patterns exposed through the first bending holes, respectively, during formation of the data lines and the links.]

[8. The method according to claim 1, further comprising:

forming an anti-etching layer in the bending area of the non-display area on the substrate, before formation of the buffer film; and forming a pre-bending hole passing through the buffer film in the bending area such that the pre-bending hole exposes at least a part of the anti-etching layer, after formation of the buffer film.

wherein the first bending hole passes through the gate insulation film and the interlayer insulation film in the pre-bending hole, in a width smaller than the pre-bending the hole to expose the anti-etching layer, during formation of the first bending hole, and the link directly contacts at least a part of the anti-etching layer exposed through the pre-bending hole and the first bending hole in the bending area, during formation of the link.]

*9. A display device comprising:*

*a flexible substrate including a display area, a pad area, and a bending area between the display area and the pad area;*

*a plurality of insulation films including a buffer film, a gate insulation layer and an interlayer insulation film, which are sequentially formed on the flexible substrate, at least one first hole passing through at least one of the buffer film, the gate insulation film and the interlayer insulation film in the bending area;*

*a plurality of link lines crossing the bending area on the interlayer insulating film, each of the link lines including a portion disposed above the at least one first hole in the bending area, wherein at least a portion of the at least one first hole is provided between two adjacent link lines in the bending area;*

*a plurality of gate lines and a plurality of data lines formed on the flexible substrate;*

*a plurality of thin film transistors formed at intersections between the gate lines and the data lines; and*

*a plurality of pads formed in the pad area, each pad electrically connected with one of the gate or data lines.*

*10. The display device according to claim 9, wherein the link lines are formed in a link area of the flexible substrate,*

*wherein the link lines connect the respective pads to the gate and data lines on the flexible substrate, and*

*wherein the bending area and the link area overlap with each other.*

*11. The display device according to claim 10, wherein the bending area is wider than the link area.*

*12. The display device according to claim 10, wherein the link area is wider than the bending area.*

*13. The display device according to claim 9. wherein the link lines are disposed in the bending area and in a link area of the flexible substrate.*

*14. The display device according to claim 9, further comprising:*

*at least one second hole formed within the at least one first hole,*

*the at least one second hole being located at a periphery area of one of the link lines, and passing through a part of one of the insulation films.*

*15. The display device according to claim 14, wherein the at least one second hole exposes an upper surface of the flexible substrate in the bending area.*

*16. The display device according to claim 14, further comprising:*

*a protective film covering the link lines,*

*wherein the at least one second hole passes through the protective film.*

*17. The display device according to claim 16, further comprising:*

*an active layer formed in a part of a pixel area on the buffer film;*

*a gate electrode formed on the gate insulation layer,*

*source and drain electrodes on the interlayer insulation film;*

*a first electrode on the protective film;*

*a light emitting layer on the first electrode; and*

*a second electrode on the light emitting layer.*

*18. The display device according to claim 17, further comprising:*

*a sealing layer on the second electrode in the display area.*

*19. The display device according to claim 17, further comprising:*

*a bank formed on a periphery of the pixel area on the protective film to overlap at least a part of an edge of the first electrode.*

*20. The display device according to claim 14, wherein for a pixel area in the display area, a corresponding gate line is formed on a gate insulation layer together with a gate electrode, and a corresponding link line is connected to the corresponding gate line through a link hole which passes through an interlayer insulation film to expose at least a part of the corresponding gate line.*

*21. The display device according to claim 20, further comprising:*

*a pad connected to the corresponding link line through a pad hole.*

*22. The display device according to claim 21, wherein the at least one first hole or the at least one second hole is disposed between the link hole and the pad hole.*

*23. The display device according to claim 22 wherein a length of one of the link lines is longer than a distance between the link hole and the pad hole.*

*24. The display device according to claim 9, further comprising:*

*an anti-etching layer formed between the flexible substrate and the insulation films in the bending area,*

*wherein a part of the anti-etching layer is exposed by the at least one first hole, and*

*wherein one of the link lines contacts the exposed part of the anti-etching layer in the bending area.*

*25. The display device according to claim 14, further comprising:*

*an anti-etching layer formed between the flexible substrate and the insulation films in the bending area,*

*wherein a part of the anti-etching layer is exposed by the at least one first hole,*

*wherein one of the link lines contacts the exposed part of the anti-etching layer in the bending area, and*

*wherein the at least one second hole passes through the anti-etching layer.*

*26. The display device according to claim 9, wherein a width of each of the at least one first hole is wider than a width of each of the link lines.*

*27. The display device according to claim 9, further comprising:*

*a protective film formed on the flexible substrate,*

*wherein the protective film fills the at least one first hole in the bending area.*

*28. The display device according to claim 9, wherein the bending area is bent such that the pad area including the pads is provided under the display area of the flexible substrate.*

* * * * *